United States Patent
Tsukada et al.

(10) Patent No.: US 8,378,231 B2
(45) Date of Patent: Feb. 19, 2013

(54) SEMICONDUCTOR DEVICE AND METHOD FOR MANUFACTURING THE SAME

(75) Inventors: Kiyotaka Tsukada, Gifu (JP); Toshihiro Nomura, Gifu (JP); Daisuke Minoura, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 687 days.

(21) Appl. No.: 12/510,028

(22) Filed: Jul. 27, 2009

(65) Prior Publication Data

US 2010/0027228 A1 Feb. 4, 2010

Related U.S. Application Data

(60) Provisional application No. 61/085,111, filed on Jul. 31, 2008.

(51) Int. Cl.
*H05K 1/11* (2006.01)
(52) U.S. Cl. .......................................... 174/267; 29/845
(58) Field of Classification Search .................. 174/267; 361/791; 29/845
See application file for complete search history.

(56) References Cited

U.S. PATENT DOCUMENTS 6,444,924 B1 * 9/2002 Ishida et al. .................. 174/262
6,700,079 B2 * 3/2004 Bogursky et al. ............. 174/268

FOREIGN PATENT DOCUMENTS

JP 2004-228403 8/2004

* cited by examiner

*Primary Examiner* — Jeremy Norris
(74) *Attorney, Agent, or Firm* — Oblon, Spivak, McClelland, Maier & Neustadt, L.L.P.

(57) ABSTRACT

A semiconductor device includes wiring boards each having an insulating board, conductor circuits and through-holes, the insulating board having top and bottom surfaces, the conductor circuits formed on the top and bottom surfaces, the through holes penetrating the insulating board and electrically connecting the conductor circuits of the top and bottom surfaces; conductor posts each having flange, head and leg portions, the flange portion having first and second surfaces and having an external diameter larger than that of the through-hole, the head portion protruding from the first surface, the leg portion protruding from the second surface; and electronic components each having an electrode formed on one or more surfaces and connected to the leg portion. The head portion is inserted until the first surface of the flange portion comes into contact with the bottom surface of the wiring board and electrically connected at an inner wall of the through-hole.

23 Claims, 43 Drawing Sheets

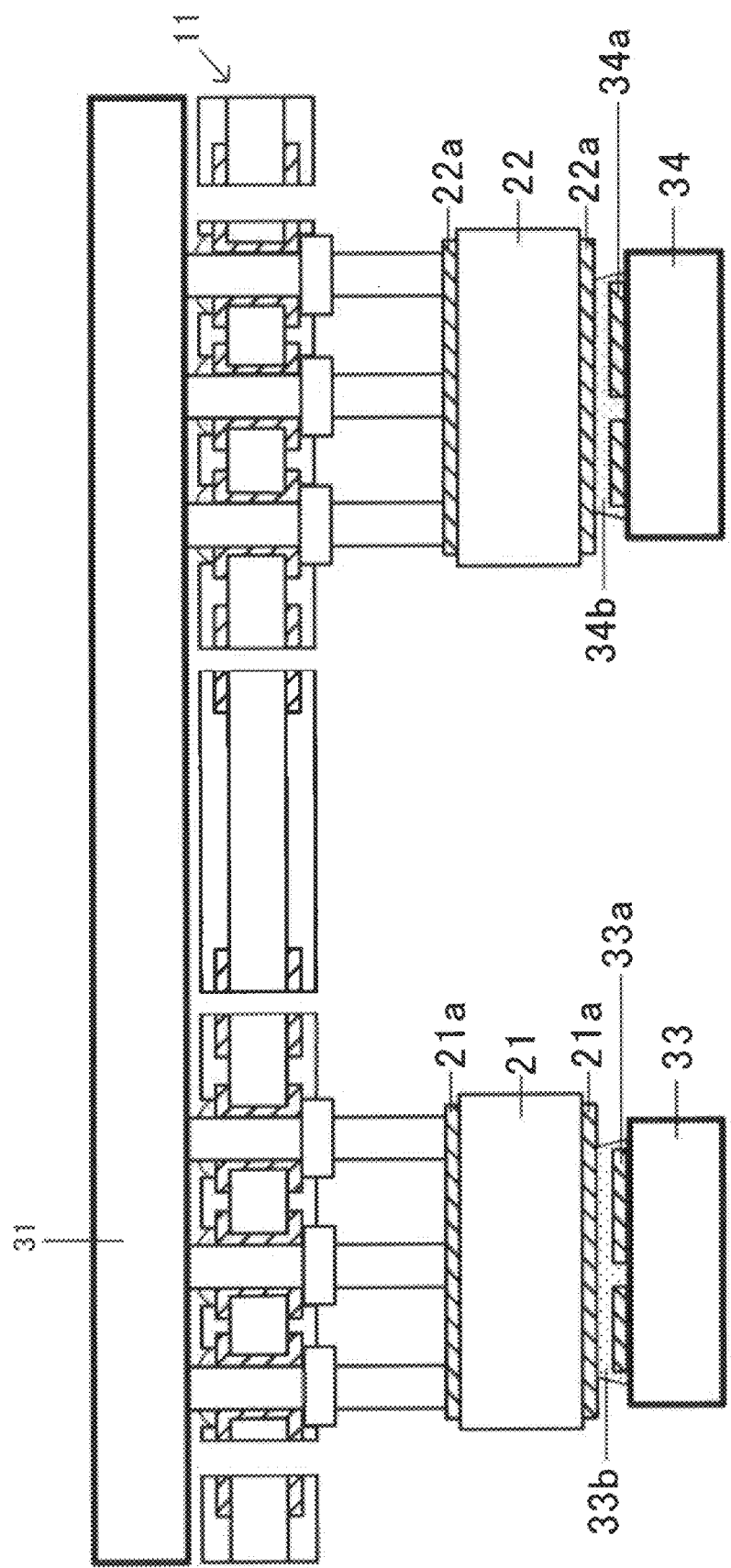

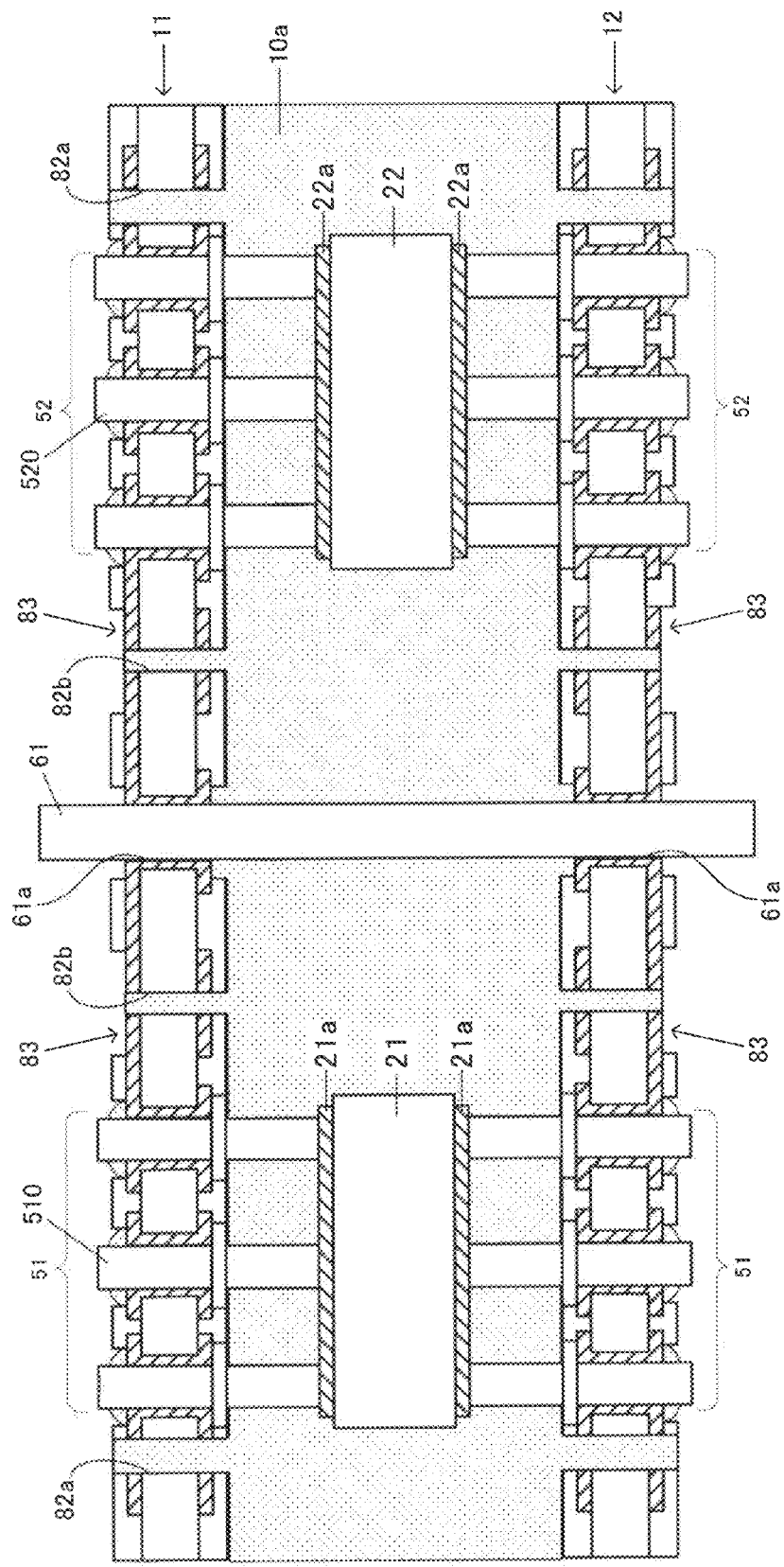

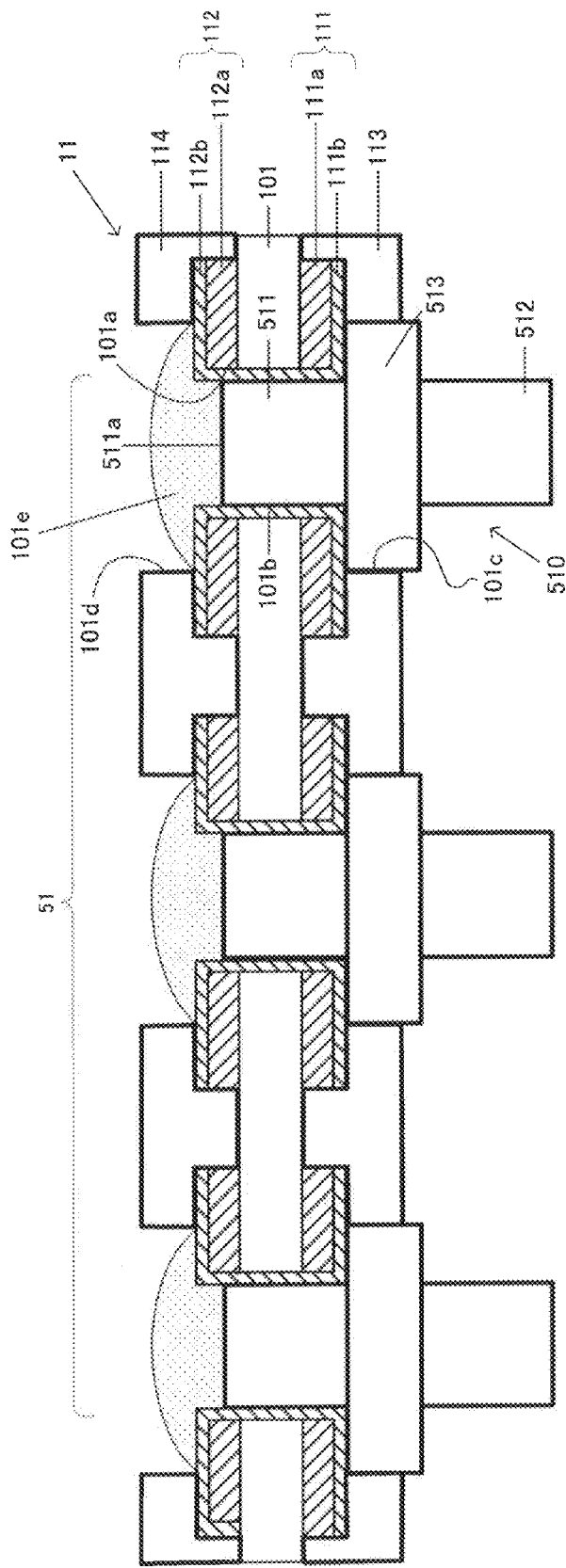

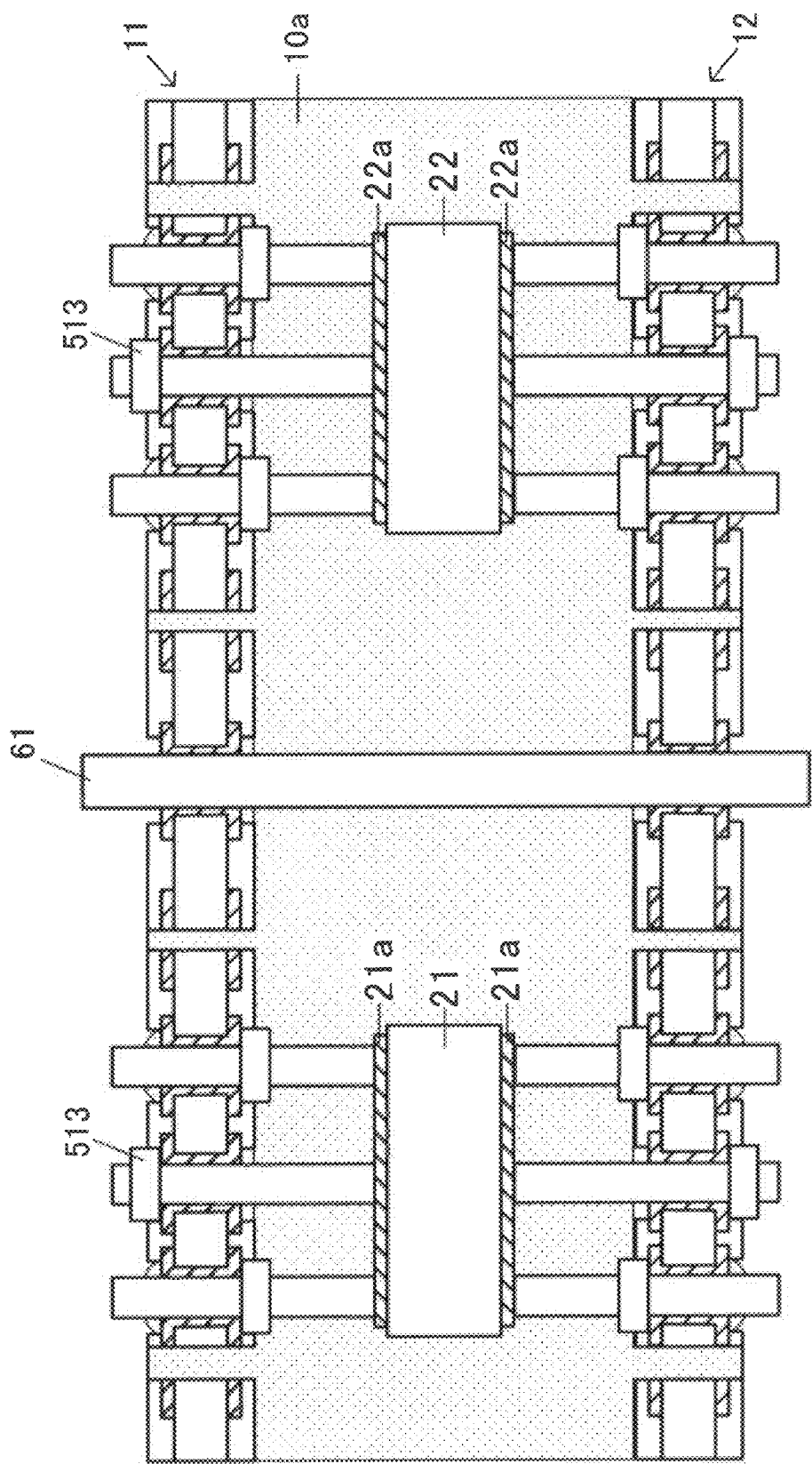

SEMICONDUCTOR DEVICE AND METHOD FOR MANUFACTURING THE SAME

CROSS-REFERENCE TO RELATED APPLICATIONS

The present application claims the benefits of priority to U.S. Application No. 61/085,111, filed Jul. 31, 2008. The contents of that application are incorporated herein by reference in their entirety.

BACKGROUND OF THE INVENTION

1. Field of the Invention

The present invention relates to a semiconductor device and a method for manufacturing the same, and in particular, to a semiconductor device that includes a wiring board that is mounted with a switching element used in an automobile electric component, an information apparatus, and an electric apparatus, for example, a power system semiconductor element, such as a power MOSFET (Metal Oxide Semiconductor Field Effect Transistor) element or an IGBT (Insulated Gate Bipolar Transistor) element, and a method for manufacturing the same.

2. Discussion of the Background

In a wiring board that mounts an electronic component, such as a semiconductor chip (IC chip), it is required to stably maintain electric connection and insulation and component support against a repetitive operation or a repetitive variation in temperature. In particular, in a power system circuit that handles a large amount of power by a power system semiconductor element (for example, a power MOSFET or an IGBT), a heat dissipation effect and durability against a repetitive heat cycle become important as characteristics of a semiconductor device. In addition, in the power system circuit, it is required to reduce a noise occurring due to a decrease in a device size and prevent an erroneous operation from occurring due to the noise.

For example, Japanese Patent Application Laid-Open (JP-A) No. 2004-228403 describes a technology for a heat dissipation effect of a power system circuit, in particular, a switching power supply device. In a device described in JP-A-2004-228403, a printed wiring board and an insulating board are disposed opposite to each other and an insulating resin is sealed between the printed wiring board and the insulating board. The printed wiring board has through-holes and a conductor pattern is formed on the printed wiring board (surface of the printed wiring board at the side that is not opposite to the insulating board). Meanwhile, a conductor pattern is formed on a top surface of the insulating board (surface of the printed wiring board at the side that is opposite to the insulating board), and a power system semiconductor element or a conductor post (column conductor) is disposed on the conductor pattern. In addition, a metal base plate (corresponding to a heat waster) is provided on a bottom surface of the insulating board. In this way, the conductor post on the insulating board is inserted into the through hole of the printed wiring board, and the conductor pattern on the printed wiring board and the conductor post are electrically connected to each other through a conductive adhesive. In this device, since the metal base plate is provided on the bottom surface (side of the semiconductor element) of the insulating board, it is possible to improve a heat dissipation effect. The contents of this publication are incorporated herein by reference in their entirety.

SUMMARY OF THE INVENTION

A semiconductor device according to a first aspect of the present invention includes wiring boards, each of which has an insulating board, conductor circuits, and through-holes, the insulating board having a top surface and a bottom surface at the side opposite to the top surface, the conductor circuits being formed on the top surface and the bottom surface of the insulating board, and the through holes being formed to penetrate the insulating board and being used to electrically connect the conductor circuit of the top surface and the conductor circuit of the bottom surface; conductor posts, each of which has a flange portion, a head portion, and a leg portion, the flange portion having a first surface and a second surface at the side opposite to the first surface and having an external diameter larger than that of the through-hole, the head portion protruding from the first surface of the flange portion, and the leg portion protruding from the second surface of the flange portion; and electronic components, each of which has an electrode formed on at least one surface and is connected to the leg portion of the conductor post. In this case, the head portion of the conductor post is inserted until the first surface of the flange portion comes into contact with the bottom surface of the wiring board, and the head portion is electrically connected at an inner wall of the through-hole.

A semiconductor device according to a second aspect of the present invention includes wiring boards, each of which has an insulating board, conductor circuits, and through-holes, the insulating board having a top surface and a bottom surface at the side opposite to the top surface, the conductor circuits being formed on the top surface and the bottom surface of the insulating board, and the through holes being formed to penetrate the insulating board and being used to electrically connect the conductor circuit of the top surface and the conductor circuit of the bottom surface; conductor posts, each of which has a flange portion, a head portion, and a leg portion, the flange portion having a first surface and a second surface at the side opposite to the first surface and having an external diameter larger than that of the through-hole, the head portion protruding from the first surface of the flange portion, and the leg portion protruding from the second surface of the flange portion; and electronic components, each of which has an electrode formed on at least one surface and is connected to the leg portion of the conductor post. In this case, the leg portion of the conductor post is inserted until the second surface of the flange portion comes into contact with the top surface of the wiring board, and the leg portion is electrically connected at an inner wall of the through-hole.

A method for manufacturing a semiconductor device according to a third aspect of the present invention includes a wiring board manufacturing process for preparing wiring boards, each of which has a top surface, a bottom surface at the side opposite to the top surface, and through-holes used to electrically connect the top surface and the bottom surface; a conductor post preparing process for preparing conductor posts, each of which has a flange portion, a head portion, and a leg portion, the flange portion having a first surface and a second surface at the side opposite to the first surface and having an external diameter larger than that of the through-hole, the head portion protruding from the first surface of the flange portion, and the leg portion protruding from the second surface of the flange portion; a conductor post connecting process for inserting the conductor post toward the top surface or the bottom surface of the wiring board; and an electronic component connecting process for connecting an electronic component to the head portion or the leg portion of the conductor post.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 24 is a cross-sectional view illustrating a semiconductor device where a printed wiring board is mounted on only one side of a semiconductor chip, which is a modification of a semiconductor device according to the present invention;

FIG. 27 is a cross-sectional view illustrating a semiconductor device where a conductor post and a conductor column are electrically connected to each other, which is a modification of a semiconductor device according to the present invention;

FIG. 29 is a cross-sectional view illustrating a semiconductor device where a front end (insertion end) of a conductor post does not protrude, which is a modification of a semiconductor device according to the present invention;

FIG. 30 is a view illustrating a modification where the configuration of the first embodiment is combined with the configuration of the second embodiment;

DETAILED DESCRIPTION OF THE EMBODIMENTS

Figure 1:
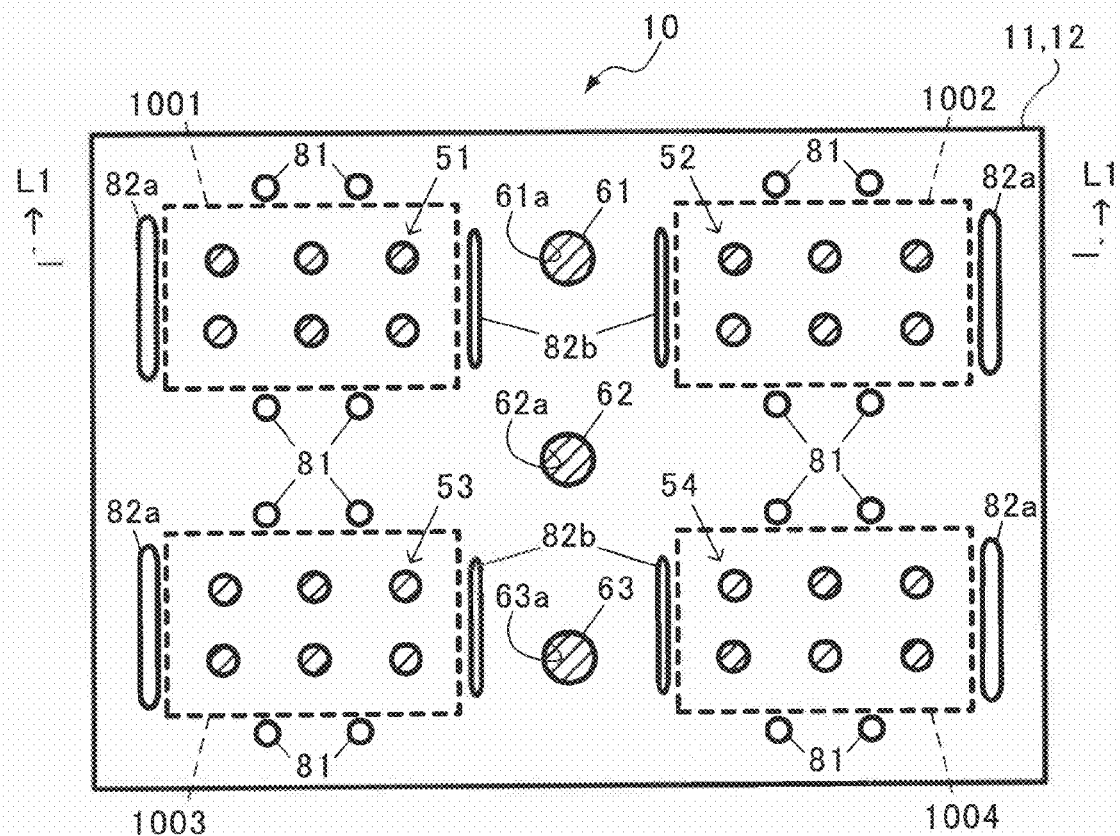
FIG. 1 is a plan view illustrating an outline of a semiconductor device according to a first embodiment of the present invention.

The embodiments will now be described with reference to the accompanying drawings, wherein like reference numerals designate corresponding or identical elements throughout the various drawings.

First Embodiment

FIG. 1 is a top view of a first embodiment of the present invention. A semiconductor device 10 is a semiconductor module where plural (for example, four) semiconductor chips (IC chips) are mounted in component mounting areas 1001 to 1004 of printed wiring boards 11 and 12, respectively. In predetermined places (the centers and the sides) of the printed wiring boards 11 and 12, through-holes 61a to 63a are formed. In order to fix the printed wiring boards 11 and 12, columns 61 to 63 that penetrate the printed wiring boards are inserted into the through-holes 61a to 63a, respectively.

In the printed wiring boards 11 and 12, conductor post groups 51 to 54 that are mounted to a common semiconductor chip are inserted into the component mounting areas 1001 to 1004, respectively. In addition, point-like through-holes 81 and slits (linear through-holes) 82a and 82b are formed around the conductor post groups 51 to 54. The point-like through-holes 81 and the slits 82a and 82b are formed separately from holes for conductor post insertion and board fixation, and formed near the conductor post groups intensively. In addition, at least one point-like through-hole 81 or at least one slit 82b is provided between the conductor post groups. In addition, the slits 82a that are formed at the outer sides (the outer circumferential portions) of the printed wiring boards 11 and 12 have a larger size (specifically, a larger width, length, and area) than the slits 82b that are formed at the inner sides (the central portions) of the printed wiring boards. Since the point-like through-holes 81 and the slits 82a and 82b are formed, it is possible to alleviate expansion and contraction or bending of the printed wiring boards, which occurs due to a change in temperature in the printed wiring boards 11 and 12.

Figure 2:
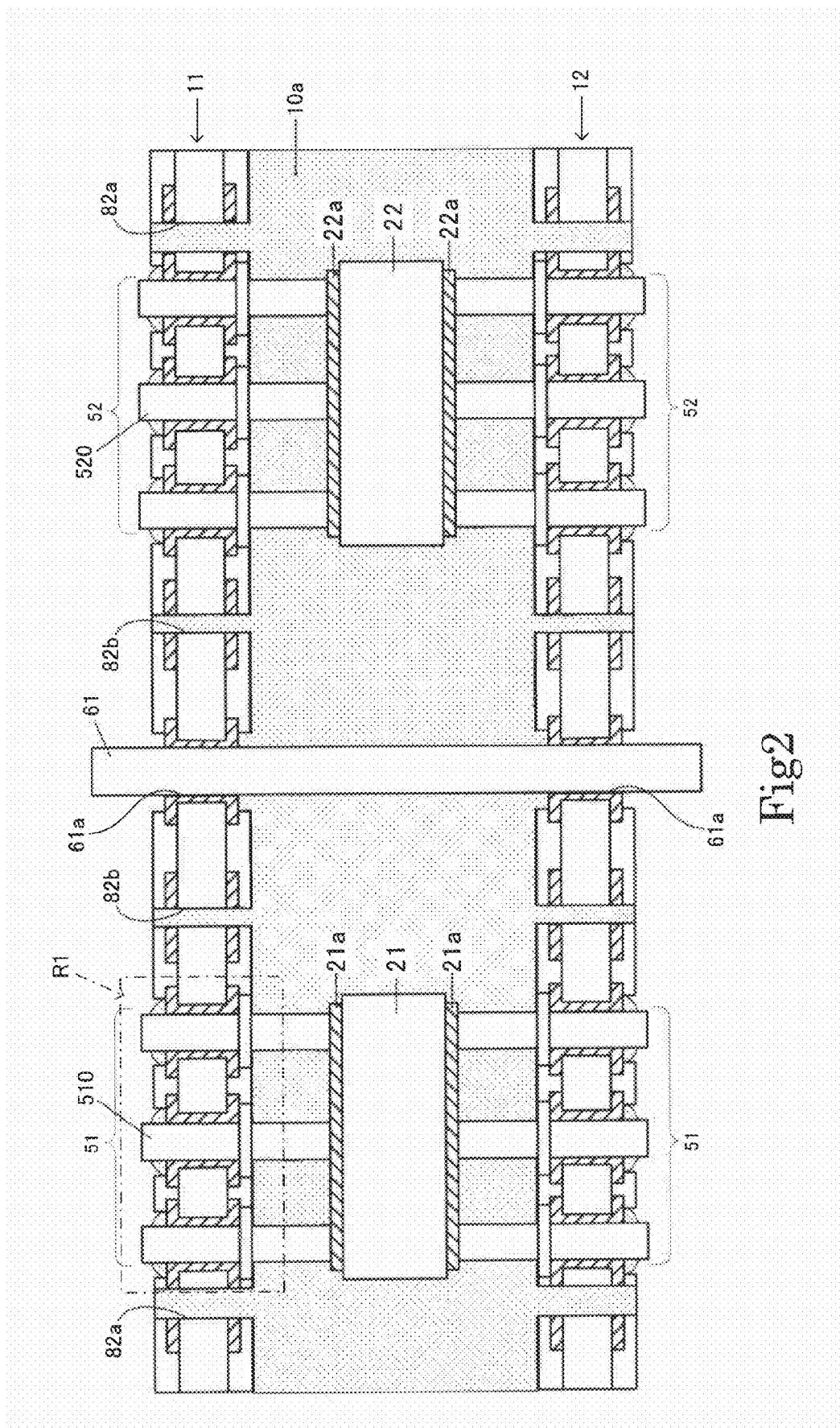
FIG. 2 is a cross-sectional view taken along the line L1-L1 of FIG. 1.

On the conductor post groups 51 and 52 among the conductor post groups of the printed wiring boards 11 and 12, the semiconductor chips 21 and 22 that are common to the printed wiring boards 11 and 12 are mounted, as shown in FIG. 2 (a cross-sectional view taken along the line L1-L1 of FIG. 1). Each of the semiconductor chips 21 and 22 is formed of a power system semiconductor element, such as, for example, an IGBT element or a power MOSFET. In addition, electrodes 21a are provided on both sides (front and rear sides) of the semiconductor chip 21 and electrodes 22a are provided on both sides of the semiconductor chip 22. As the electrodes 21a and 22a, for example, an emitter electrode, a collector electrode, or a ground electrode may be considered.

The printed wiring boards 11 and 12 are disposed opposite to each other such that they interpose the semiconductor chips 21 and 22 therebetween, and have circuits provided on the front and rear sides of the boards. In addition, the circuits are electrically connected to the semiconductor chips (semiconductor chips 21 and 22) through the conductor post groups 51 to 54. In addition, an insulating resin 10a is filled in a space between the printed wiring boards 11 and 12 so as to cover (seal) the semiconductor chips 21 and 22.

Since the printed wiring boards 11 and 12 basically have the same structure, only the structure (refer to FIG. 3) of the printed wiring board 11 will be described in detail and a detailed description of the structure of the printed wiring board 12 will be omitted.

Figure 3:
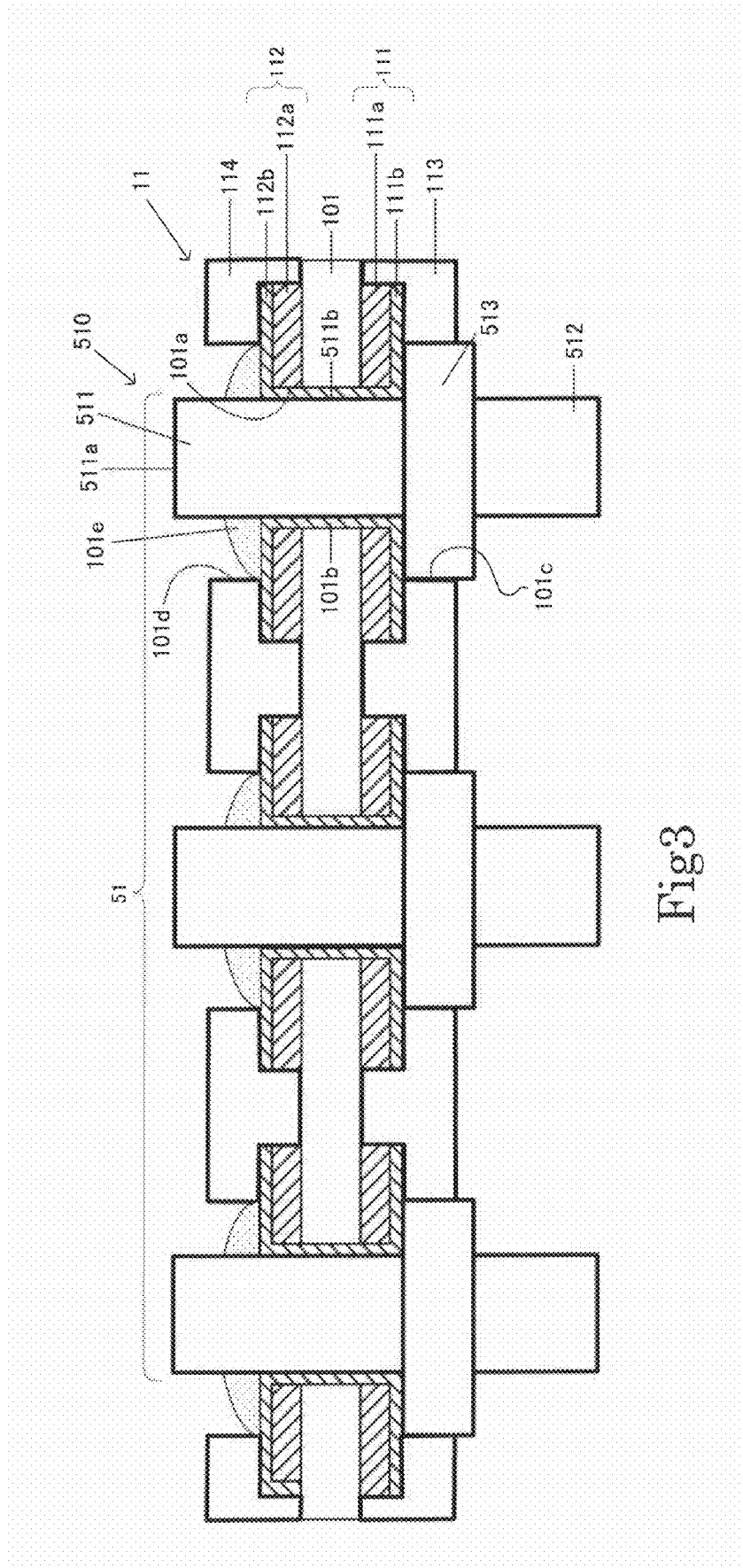
FIG. 3 is an enlarged view illustrating an area R1 of FIG. 2.

For example, as shown in FIG. 3 (which is an enlarged view of the area R1 shown in FIG. 2), the printed wiring board 11 has an insulating board 101. On both sides (front and rear sides) of the insulating board 101, conductor patterns (wiring patterns) 112 and 111, each of which is composed of two layers (a copper foil 112a and a copper plating film 112b or a copper foil 111a and a copper plating film 111b), are formed, respectively. Further, as the insulating board 101, a resin board may be used, which is obtained by impregnating a glass cross having a thickness in a range of, for example, "0.1 to 1.0 mm" with a BT (bismaleimide triazine) resin or an epoxy resin and curing the resultant. However, the present invention is not limited thereto, and other boards may be used. For example, a ceramic board, which is made of, for example, alumina ($Al_2O_3$), silicon carbide (SiC), or aluminum nitride (AlN), may be effectively used as the insulating board 101.

The ceramic is a material where the board is rarely bent due to a change in temperature. Therefore, when the ceramic board is adopted, formation of the slits (slits 82a and 82b) that are used to prevent the board from being bent may be omitted, according to a utilization purpose. In addition, the thickness of the wiring line that is provided on the printed wiring board 11 (film thickness of the conductor patterns 111 and 112) is preferably in a range of "100 to 250 μm", and more preferably in a range of "135 to 250 μm". It is preferable that the printed wiring board 11 has a structure where front and rear sides are symmetrical to each other.

In addition, the printed wiring board 11 is provided with a cylindrical through-hole 101a that penetrates the front and rear sides of the printed wiring board. An inner wall of the through-hole 101a is provided with a through-hole conductor 101b that electrically connects conductor patterns of both sides of the printed wiring board 11 to each other. The through-hole conductor 101b is formed by a plating film that is connected to the copper plating films 112b and 111b (conductor patterns 112 and 111) of the front and rear sides of the printed wiring board.

Figure 4A:
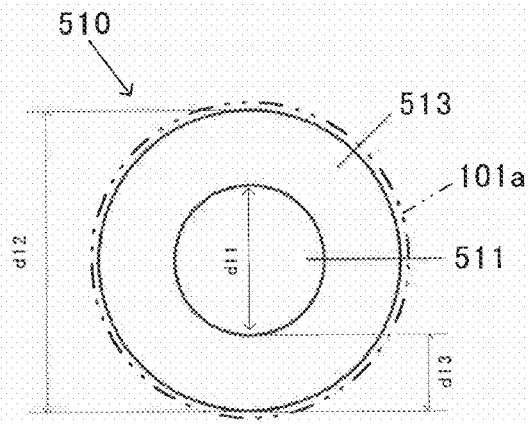
FIG. 4A is a plan view illustrating a conductor post.

A conductor post 510 (conductor pin) is inserted into the through-hole 101a, which forms a so-called implant structure. In this case, as shown in FIG. 4A (a plan view) and 4B (a side view), the conductor post 510 has a flange portion 513 that protrudes in a radial direction with respect to a columnar shaft, and a head portion 511 and a leg portion 512 that protrude to both sides of the flange portion on the basis of the flange portion. The flange portion 513 is formed as a ring that covers an outer circumference of the shaft of the conductor post 510.

The head portion 511 according to the first embodiment is a portion of the conductor post 510 that protrudes from a first surface (a top surface 513a of the flange portion 513) of the flange portion 513. The leg portion 512 is a portion of the conductor post that protrudes from a second surface (a bottom surface 512b of the flange portion 513) of the flange portion 513. In addition, the first surface of the flange portion 513 indicates a surface where the flange portion 513 comes into contact with the printed wiring board, and the second surface that is opposite to the first surface indicates a surface at the side that is opposite to the semiconductor chip 21, as show in FIG. 2.

In the shaft and the flange portion 513 of the conductor post 510, horizontal section shapes thereof that are orthogonal in an axial direction form a concentric circle shape, as shown in FIG. 4A. The diameter d11 (diameter common to the head portion 511 and the leg portion 512) of the horizontal section shape of the shaft of the conductor post 510 is preferably in a range of "450 to 550 μm" and more preferably "500 μm". The diameter d12 of the horizontal section shape of the flange portion 513 is in a range of "650 to 750 μm" and more preferably "700 μm". The flange portion 513 equally protrudes in a radial direction over one around of the shaft of the conductor post 510, and the equal protrusion width d13 of the flange portion 513 is preferably in a range of "50 to 150 μm" and more preferably "100 μm". Since the head portion 511 and the leg portion 512 have the same shape, the conductor post 510 has a symmetrical structure (shape) on the basis of the flange portion 513. The horizontal section shape of the head portion 511 and the horizontal section shape of the through-hole 101a are substantially similar to each other. The thickness (diameter) of the head portion 511 may be smaller than or larger than the diameter of the through-hole 101a. If the thickness of the head portion 511 is smaller than the diameter of the through-hole 101a, metal paste, such as solder, which is used in the following process, can be easily entered between the through-hole and the conductor post. In contrast, if the thickness of the head portion 511 is larger than the diameter of the through-hole 101a, the through-hole and the conductor post can directly come into contact with each other.

In addition, the flange portion 513 is provided at the central location of the conductor post 510 at which distances from both ends (a front end 511a and a rear end 512a) of the conductor post 510 become equal to each other. That is, the length d21 of the head portion 511 (distance between the top surface 513a (first surface) of the flange portion 513 and an end face of the front end 511a) becomes equal to the length d22 of the leg portion 512 (distance between the bottom surface 513 (second surface) of the flange portion 513 and an end face of the rear end 512a). The lengths d21 and d22 each are preferably in a range of "0.9 to 1.1 mm" and more preferably "1.0 mm".

As shown in FIG. 3, the conductor post 510 is, for example, inserted into the through-hole 101a starting from the front end 511a. The conductor post 510 is inserted until the flange portion 513 comes into contact with one surface (for example, a bottom surface) of the printed wiring board 11. Further, solder resists 113 and 114 (protective films) are formed on the surfaces of the conductor patterns 111 and 112. In addition, both surfaces (a top surface and a bottom surface) of the printed wiring board 11 are covered entirely by the solder resists 113 and 114, and the front end 511a of the conductor post 510 is exposed from an opening of the solder resist 114 in the top surface of the printed wiring board 11.

On both surfaces of the printed wiring board 11, concave portions 101c and 101d are formed by means of the solder resists 113 and 114, respectively. A solder 101e is provided in the concave portion 101d. The solder 101e comes into contact with the side 511b of the head portion 511 and the top surface of the conductor pattern 112 (specifically, copper plating film 112b), and electrically and physically connects the conductor post 510 and the peripheral conductor thereof to each other.

In the through-hole 101a, the side 511b of the head portion 511 directly comes into contact with the through-hole conductor 101b. In this way, the conductor post 510 and the through-hole conductor 101b are electrically and physically connected to each other. The connection reliability of the conductor post 510 is improved by integrally forming the conductor patterns 112 and 111 and the through-hole conductor 101b.

Figure 5:
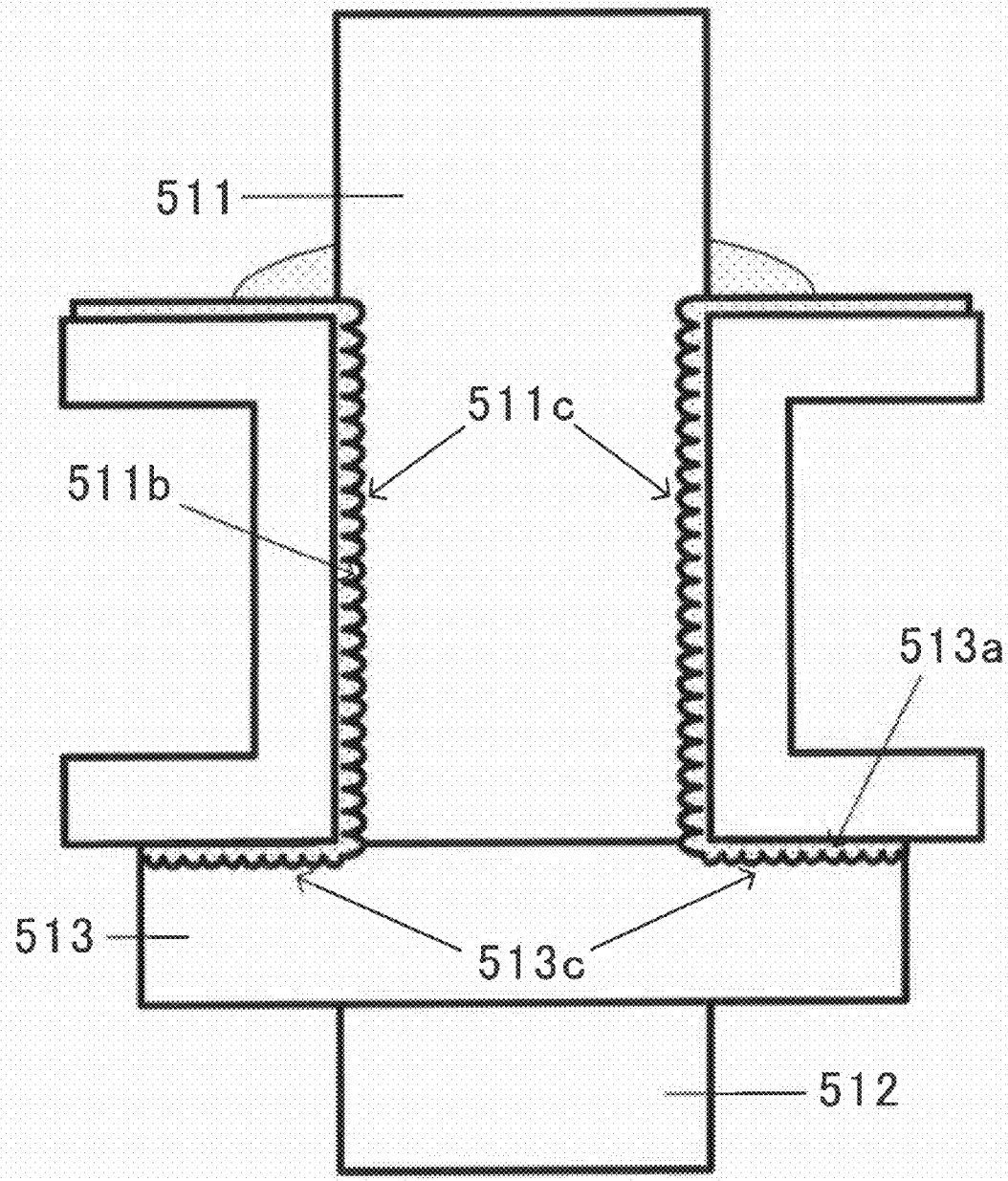
FIG. 5 is an enlarged view illustrating a contact portion between a conductor post and a through-hole conductor.

More specifically, as shown in FIG. 5, in the top surface 513a (surface that comes into contact with the bottom surface of the printed wiring board 11) of the flange portion 513 and the side 511b (surface that comes into contact with the through-hole conductor 101b) of the head portion 511 of the conductor post, multiple minute concavo-convex portions 513c and 511c are formed. In addition, in gaps between the conductor post 510 and the printed wiring board 11, specifically, a gap between the top surface 513a of the flange portion 513 and the bottom surface of the printed wiring board 11 and a gap between the side 511b of the head portion 511 of the conductor post and the through-hole conductor 101b, the solder 101e (conductive material) is entered and filled. By this structure, electric resistance (connection resistance) of a connection portion of the conductor post 510 decreases.

The concave portion 101c of the bottom surface (semiconductor chip side) of the printed wiring board 11 has a shape that corresponds to an outer shape of the flange portion 513, and the flange portion 513 is disposed in the concave portion 101c. Since the concave portion 101c is provided, it is possible to easily position the conductor post 510 at a high precision.

Figure 6:
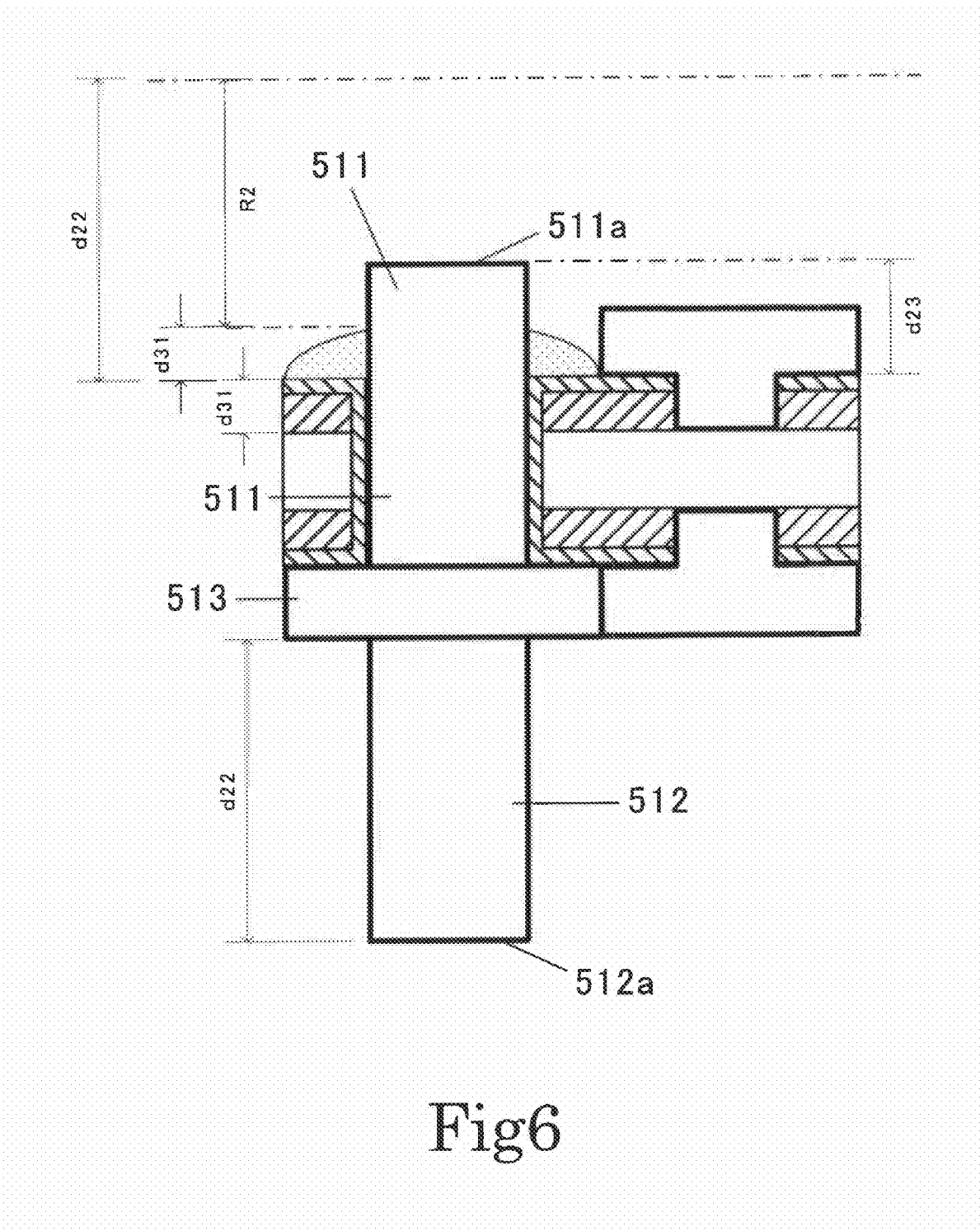
FIG. 6 is a diagram illustrating the height of an end face of a front end (protruding end) of a conductor post.

Both ends (a front end 511a and a rear end 512a) of the conductor post 510 protrude from both surfaces (a top surface and a bottom surface) of the printed wiring board 11. Between them, the front end 511a of the conductor post 510 protrudes from a top surface (surface opposite to one surface that comes into contact with the flange portion 513) of the printed wiring board 11. As such, the front end 511a (one end that is inserted into the through-hole) of the conductor post 510 protrudes, thereby obtaining a high heat dissipation effect. Specifically, as shown in FIG. 6, the end face of the front end 511a protrudes more in a axial direction of the conductor post 510 than the top surface of the conductor pattern 112 (specifically, copper plating film 112b). The protrusion amount d23 in a axial direction of the conductor post 510 is preferably set in a range R2 of not less than the thickness d31 of the wiring line (conductor pattern 112) on the printed wiring board 11 to not more than the length d22 of the leg portion 512. In addition, the end face of the front end 511a of each conductor post 510 in the conductor post group 51 is preferably on the same plane. In this way, a heat characteristic can be equally maintained between the multiple conductor posts 510.

Figure 7:
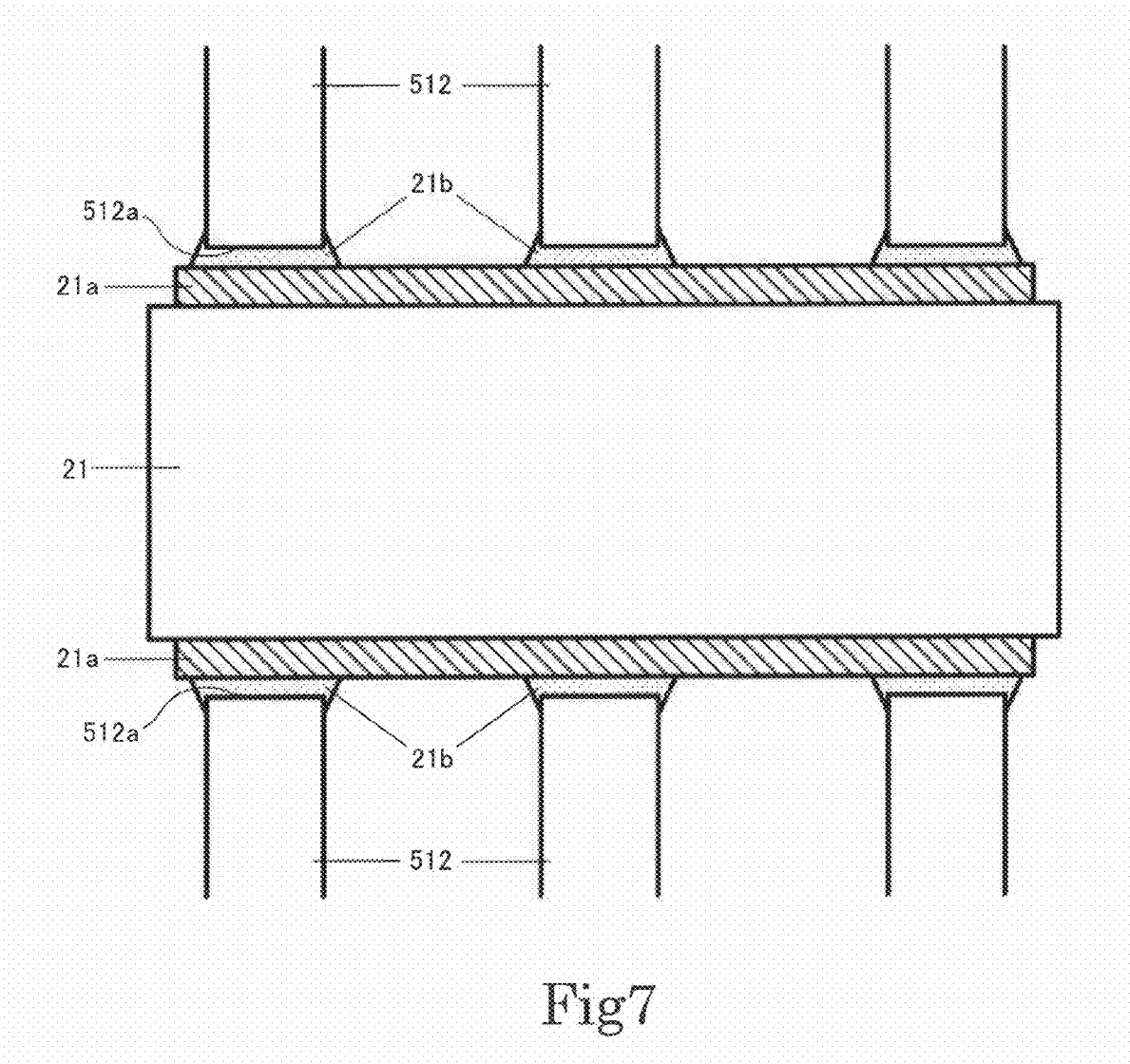
FIG. 7 is a diagram illustrating a connection portion between a conductor post and a semiconductor chip.

In the rear ends (ends opposite to one end that is inserted into the through-hole 101a) of the conductor posts 510 and 520, the semiconductor chips 21 and 22 are respectively mounted (specifically, mounted to the electrodes 21a and 22a of the front and rear sides of the chips), as shown in FIG. 2. For example, as shown in FIG. 7, the rear end 512a of the conductor post 510 is mounted on the electrodes 21a of the front and rear sides of the semiconductor chip 21 by means of the solder 21b. The rear end 512a of the conductor post 510 is preferably soldered under the same condition for each conductor post group 51. In this way, in the connection portion thereof, excellent electric connection and heat conduction can be obtained. In addition, the end face of the rear end 512a of each conductor post 510 in the conductor post group 51 is preferably on the same plane. However, even though the end face of the rear end 512a is not on the same plane but exists in a gap between the rear end 512a and the electrode 21a of the semiconductor chip 21, electric connection can be achieved by filing the solder therein. A connection method that is used to connect the conductor post and the semiconductor chip is not limited to solder bonding, and may be metal bonding, such as, for example, bonding between coppers.

In this case, as shown in FIGS. 8A to 8D (FIG. 8A: a perspective view, FIG. 8B: a plan view, FIG. 8C: a cross-sectional view taken along the line L1-L1 of FIG. 8B, and FIG. 8D: a cross-sectional view taken along the line L2-L2 of FIG. 8B), the rear end 512a of the conductor post 510 has a flat area 5121 formed at its central portion and a crater 5122 formed at its peripheral portion. Further, the rear end of the conductor post 520 also has the same structure.

The flat area 5121 becomes a facing surface (specifically, a surface that faces the chip surface in parallel) of the semiconductor chip 21, and has a radial shape (specifically, a cross shape). If the flat area 5121 is used, excellent connection is obtained as electric connection between the conductor post 510 and the semiconductor chip 21. Further, metal connection between the conductor post 510 and the semiconductor chip 21 becomes easy.

The craters 5122 are disposed between radiation sides of the flat area 5121. The multiple craters 5122 (specifically, four craters) are disposed in a form of symmetrical arrangement. The four craters 5122 are disposed at equal intervals in a circumferential direction of the rear end 512a. Since escape routes of voids are formed by the craters 5122, the voids of the solder 21b come to fall out. For this reason, if the craters 5122 are provided, it is possible to reduce cracks of the rear end portion (connection portion with the semiconductor chip) of the conductor post.

In this way, the printed wiring boards 11 and 12 and the semiconductor chips 21 and 22 are electrically connected to each other through the conductor posts 510 and 520 and the through-hole conductor (for example, through-hole conductor 101b shown in FIG. 3), and electric resistance and heat resistance between the printed wiring boards and the semiconductor chips are considerably decreased. In addition, since the conductor posts 510 and 520 and the through-hole conductor come into contact with each other at metal portions (portions made of the same material), a stable characteristic is obtained, in regards to a heat cycle.

Figure 4B:
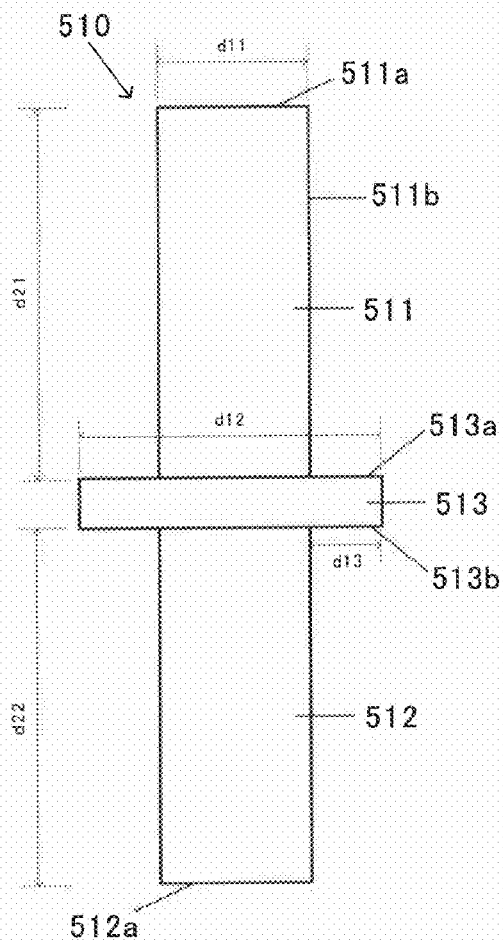
FIG. 4B is a side view illustrating a conductor post.

In addition, the printed wiring boards 11 and 12 and the semiconductor chips 21 and 22 generally have heat expansion coefficients that are different from each other. For this reason, if a change in temperature is large, heat distortion occurs between the printed wiring boards and the semiconductor chips, due to a difference between the heat expansion amounts (or the heat contraction amounts). The conductor posts 510 and 520 that connect the printed wiring boards and the semiconductor chips can achieve an effect of suppressing the heat distortion. That is, the conductor posts 510 and 520 are deformed, thereby absorbing the heat distortion and alleviating heat stress that is applied to the printed wiring boards 11 and 12 or the semiconductor chips 21 and 22. In particular, the head portion 511 and the leg portion 512 of the conductor posts 510 and 520 in the semiconductor device 10 have a diameter that is smaller than that of the flange portion 513, as shown in FIGS. 4A and 4B. As such, since the head portion 511 and the leg portion 512 are minutely formed in a rod shape, the conductor posts 510 and 520 become easily deformed, thereby heat efficiently suppressing the heat distortion.

The semiconductor device 10 can be manufactured by manufacturing the printed wiring boards 11 and 12 using, for example, a known tenting method, connecting the conductor post groups 51 to 54 (refer to FIG. 1) to the printed wiring boards 11 and 12, and mounting the semiconductor chips to the conductor post groups 51 to 54. Further, since the manufacturing processes of the printed wiring boards 11 and 12 are basically the same, only the manufacturing process of the printed wiring board 11 will be described in detail herein.

Figure 9A:
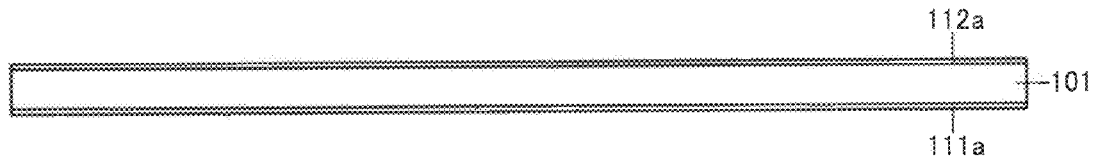
FIGS. 9A-9C are cross-sectional views illustrating a process for manufacturing a printed wiring board in a method for manufacturing a semiconductor device according to an embodiment of the present invention.
Figure 9B:
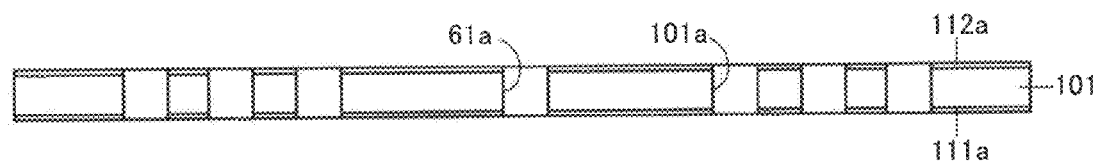

When the printed wiring board 11 is manufactured, first, for example, as shown in FIG. 9A, a both-sided copper clad laminate is prepared in which the copper foils 112a and 111a having a thickness of, for example, "18 μm" are laminated on both sides (front and rear sides) of the insulating board 101. Then, for example, as shown in FIG. 9B, through-holes 61a to 63a (refer to FIG. 1) and the through-hole 101a are formed (punched) in predetermined places by means of a drill or a laser, for example.

Figure 9C:
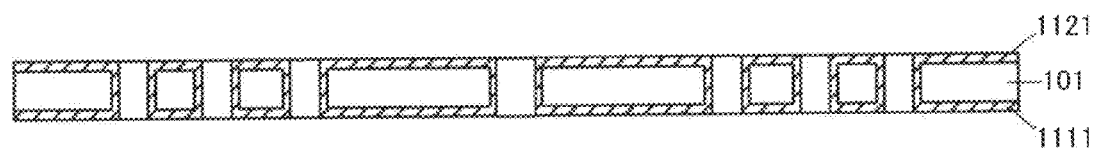

Next, for example, as shown in FIG. 9C, copper films are further formed on the copper foils 111a and 112a by copper plating (non-electrolytic plating and electrolytic plating) to allow each copper film to have a large thickness, thereby forming copper films 1111 and 1121.

Figure 10A:
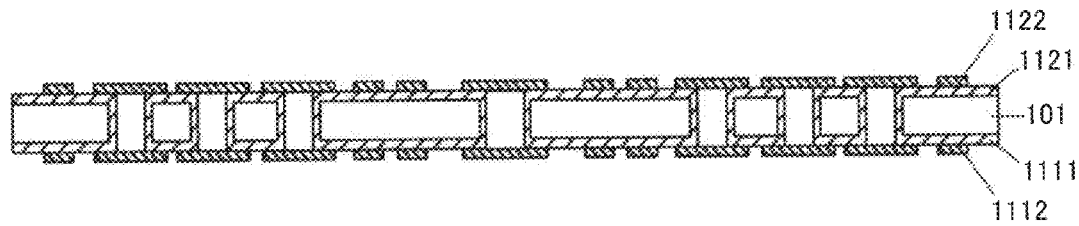
FIGS. 10A-10C are cross-sectional views illustrating a process for manufacturing a printed wiring board in the manufacturing method according to the same embodiment.
Figure 10B:
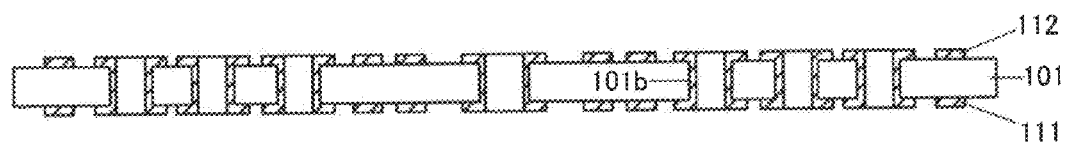

Next, as shown in FIG. 10A, etching resists 1112 and 1122 are formed on the copper films 1111 and 1121, subjected to a predetermined lithography process (for example, preprocessing, laminating, exposing, and developing) to be patterned, and subjected to a predetermined etching process (for example, etching, film removing, and inner layer inspection), thereby patterning the copper films 1111 and 1121, as shown in FIG. 10B. As a result, the conductor patterns 111 and 112 are formed as the wiring patterns and the through-hole conductor 101b is formed as interlayer connection.

Figure 10C:
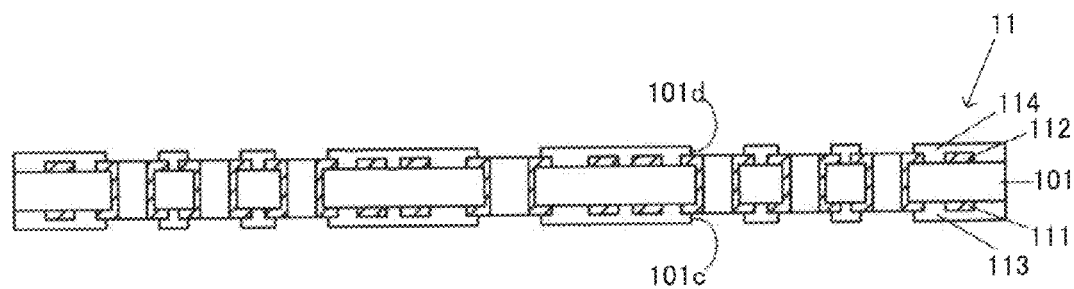

Next, as shown in FIG. 10C, solder resists 114 and 113 are formed (film-formed or patterned) on the front and rear sides of the board. In this way, the above-described printed wiring board 11 shown in FIG. 3 is finished. Further, each surface of the conductor patterns 111 and 112 is roughened by soft etching, and wiring layers (conductor circuits) and interlayer insulation films (including interlayer connection) are laminated by the number of needed layers using, for example, a well-known buildup method, thereby manufacturing a multilayer printed wiring board.

Next, the conductor post groups 51 to 54 (refer to FIG. 1) are erected on the printed wiring boards 11 and 12 that are manufactured using the above-described sequence. Since the erecting processes of the conductor post groups 51 to 54 are basically the same, only the erecting processes of the conductor post groups 51 and 52 will be described in detail herein.

Figure 11A:
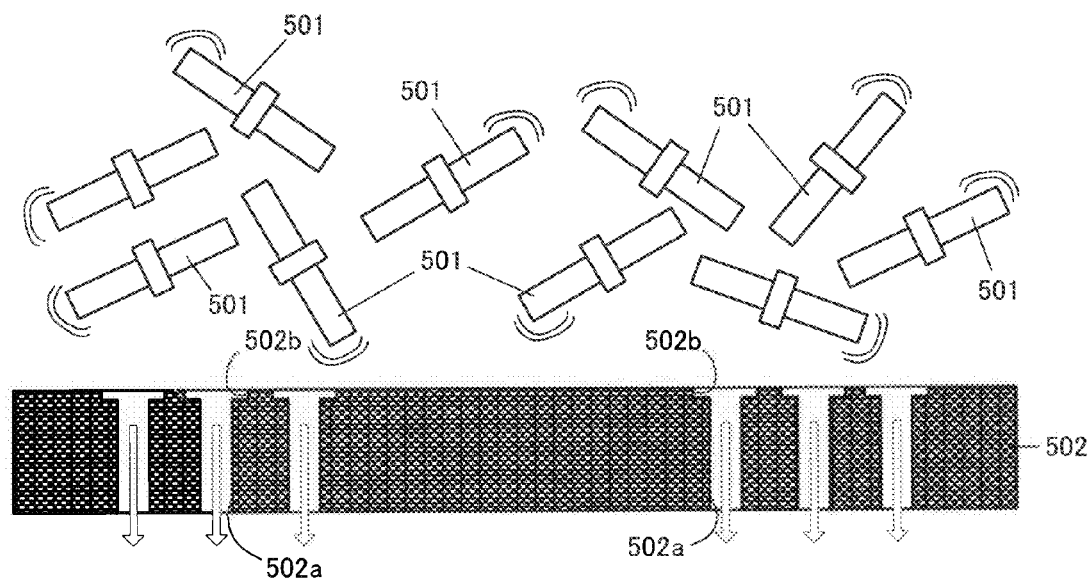
FIGS. 11A-11B are cross-sectional views illustrating a process for erecting a conductor post group on a printed wiring board in the manufacturing method according to the same embodiment.

When the conductor post groups 51 and 52 are inserted, first, for example, as shown in FIG. 11A, multiple conductor posts 501 (of the same number as the number of through-holes 101a to be inserted and formed in at least the printed wiring board 11, preferably, the number that is larger than the number of through-holes 101a), and a post erecting jig 502 are prepared. The multiple conductor posts 501 each have the structure, which is shown in FIGS. 4A, 4B, and 5. The conductor post 501 can be manufactured by, for example, casting or press machining. The minute concavo-convex portions 511c and 513c (refer to FIG. 5) of the side of the conductor post and the top surface of the flange portion may be formed by beating or cutting the surfaces thereof using for example, the jig. The flange portion and the shaft of the conductor post 501 may be integrally formed or combined after being individually formed. Meanwhile, the post erecting jig 502 has multiple through-holes 502a, which have the shape (columnar shape), the number, the arrangement, and the angle (corresponding to a direction of a hole) corresponding to the through-holes 101a. One of open ends of the through-hole 502a is chamfered (diameter-expanded). As a result, the concave portion 502b that has a shape corresponding to an external shape of the flange portion 513 is formed. In this way, it is possible to easily position and insert the conductor post 501.

Figure 11B:
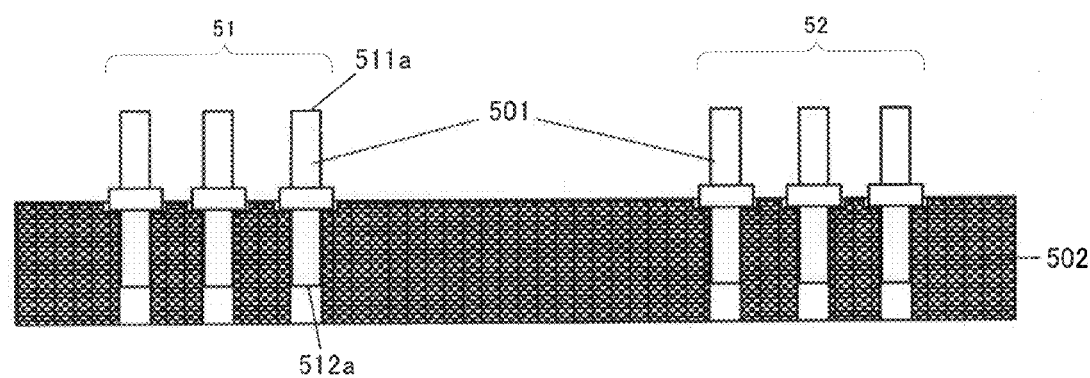

Next, in order to insert the conductor post 501 into the through-hole 502a, a vacuum processing device, such as, for example, a vacuum pump, is used to suck the conductor post 501 from an end of the through-hole 502a toward an arrow direction of FIG. 11A (from a formation surface of the concave portion 502b of the post erecting jig 502 to a surface opposite to the formation surface). At this time, the conductor post 501 is guided to the through-hole 502a by vibrating or rocking the post erecting jig 502. If the conductor post 501 is not inserted in a normal state, for example, only a portion of the conductor post 501 is inserted into the through-hole 502a, the conductor post is removed using, for example, a brush. In addition, in order that the conductor post 501 is newly prepared and inserted into the through-hole 502a again, the vibrating or rocking and sucking are performed. The above-described processes are repeated until the conductor posts 501 are inserted into all of the through-holes 502a. When the conductor post 501 is inserted into the through-hole 502a, the flange portion 513 functions as a stopper. In this way, as shown in FIG. 11B, the conductor post groups 51 and 52 (conductor post 501) having predetermined arrangement are prepared in the post erecting jig 502. If a change (measured by, for example, a pressure instrument) in a sucking force of the vacuum processing device is used, it is possible to determine whether the conductor posts 501 are inserted into all of the through-holes 502a. In addition, since the conductor post 501 has a symmetrical shape on the basis of the flange portion, it is possible to insert the conductor post 501 into the through-hole 502a without discriminating between the front end and the rear end (and between the head portion and the leg portion). That is, during the insertion process, it is not necessary to consider (specially manage) whether any one of the ends of the conductor post 501 corresponds to the front end or the rear end, and whether the conductor post 501 is inserted from any one of the ends. One end (end in the through-hole 502a) of the conductor post 501 that is inserted into the post erecting jig 502 becomes the rear end 512a, and the other end thereof (end that protrudes from the through-hole 502a) becomes the front end 511a (refer to FIG. 4B).

Figure 12A:
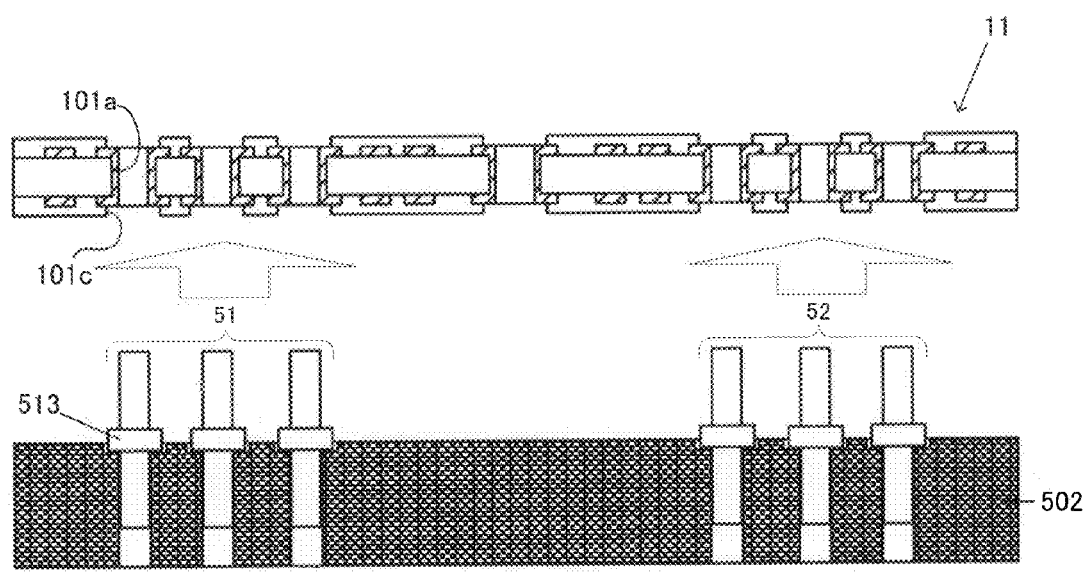
FIGS. 12A-12B are cross-sectional views illustrating a process for erecting a conductor post group on a printed wiring board in the manufacturing method according to the same embodiment.

Next, for example, a brush is used to remove the conductor post 501 that is not inserted into the post erecting jig 502. Then, as shown in FIG. 12A, the post erecting jig 502 that erects the conductor post 501 and the printed wiring board 11 that is manufactured by the processes of FIGS. 9A to 10C are disposed opposite to each other, and each conductor post 501 and each through-hole 101a where each conductor post 501 is to be inserted are aligned with each other.

Next, in a state where the post erecting jig 502 and the printed wiring board 11 are made become close (made approach each other) and aligned with each other, each conductor post (conductor post groups 51 and 52) of the post erecting jig 502 is inserted into each through-hole 101a of the printed wiring board 11. At this time, the conductor post 510 (or the conductor post 520) is inserted until the flange portion 513 comes into contact with one surface (for example, a bottom surface) of the printed wiring board 11, and the flange portion 513 is engaged to the concave portion 101c. That is, the flange portion 513 functions as a stopper or an aligning guide.

Figure 12B:
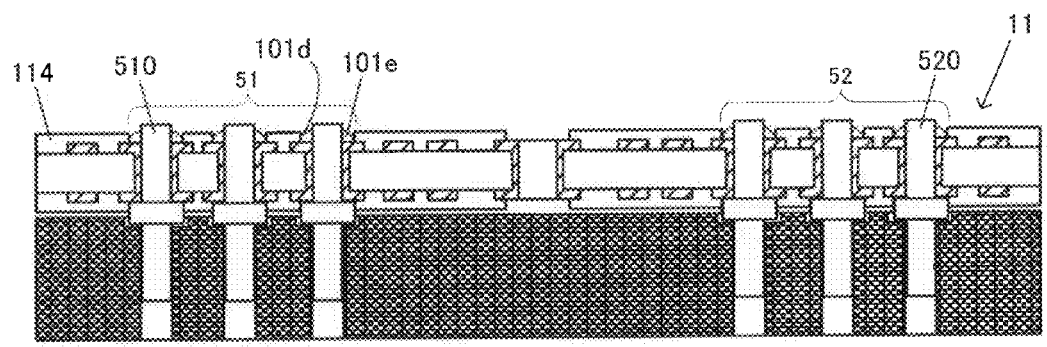

Next, as shown in FIG. 12B, in the concave portion 101d of the solder resist 114, a solder 101e (solder paste) that is used to fix the conductor post 510 (or the conductor post 520) to the printed wiring board 11 is printed using a known method. As a material of the solder 101e, a material (for example, Sn—Sb) that has a higher melting point than a solder material (for example, eutectic solder) to form a bump is preferably used. In this way, even when an integrated circuit chip is mounted hereinafter, it becomes difficult to solve the solder 101e, thereby preventing the conductor post 510 from falling out.

Figure 13A:
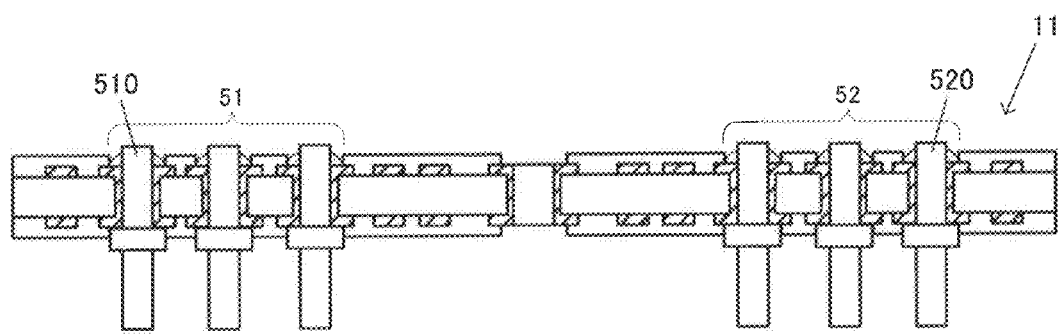
FIG. 13A is a cross-sectional view illustrating a printed wiring board on which a conductor post group is erected in the manufacturing method according to the same embodiment.

Then, the printed wiring board 11 where the conductor posts 510 and 520 are inserted is entered into a reflow furnace for each post erecting jig 502. As a result, the solder 101e becomes wet and diffused, and the solder 101e is entered (refer to FIG. 5) in the gaps between the conductor posts 510 and 520 and the printed wiring board 11, which results in fixing the conductor posts 510 and 520 to the printed wiring board 11. Then, if the post erecting jig 502 is removed, as shown in FIG. 13A, thereby obtaining a conductor post attached printed wiring board where the printed wiring board 11 and the conductor posts 510 and 520 are integrally formed. Further, an insertion method of the conductor post is not limited to the above-described method. For example, when the conductor post 510 has an asymmetrical shape on the basis of the flange portion, the conductor post may be inversely inserted. In this case, it is preferable to insert each conductor post while paying attention to the direction of the conductor post.

Figure 13B:
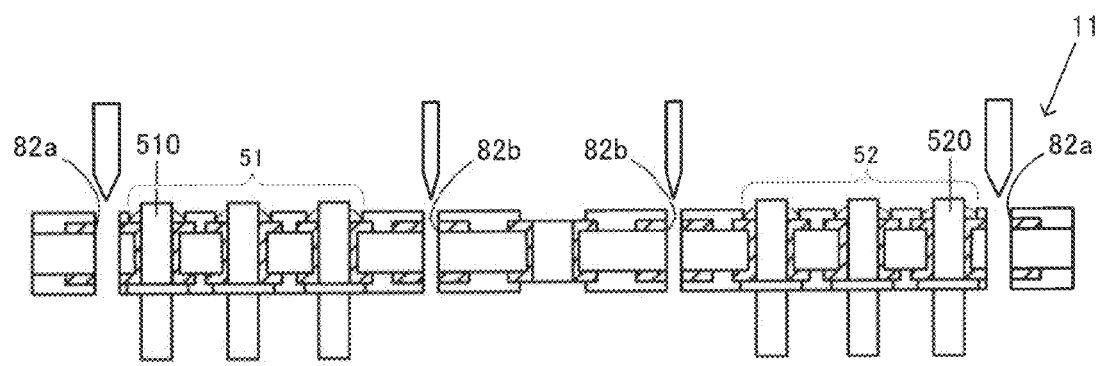
FIG. 13B is a cross-sectional view illustrating a process for forming point-like through-holes and linear through-holes in a printed wiring board in the manufacturing method according to the same embodiment.

Next, as shown in FIG. 13B, in the predetermined places (refer to FIG. 1) of the conductor post attached printed wiring board, for example, by means of a drill or router processing, the point-like through-holes 81, and the slits 82a (large slits) and the slits 82b (small slits) as cuts are formed.

In this way, the printed wiring board 11 before the semiconductor chip is mounted is finished. Similar to the case of the printed wiring board 11, with respect to the printed wiring board 12, the conductor post attached printed wiring board is manufactured by the processes shown in FIGS. 9A to 13B, and the point-like through-holes 81 and the slits 82a and 82b are formed in the predetermined places (refer to FIG. 1).

Figure 14A:
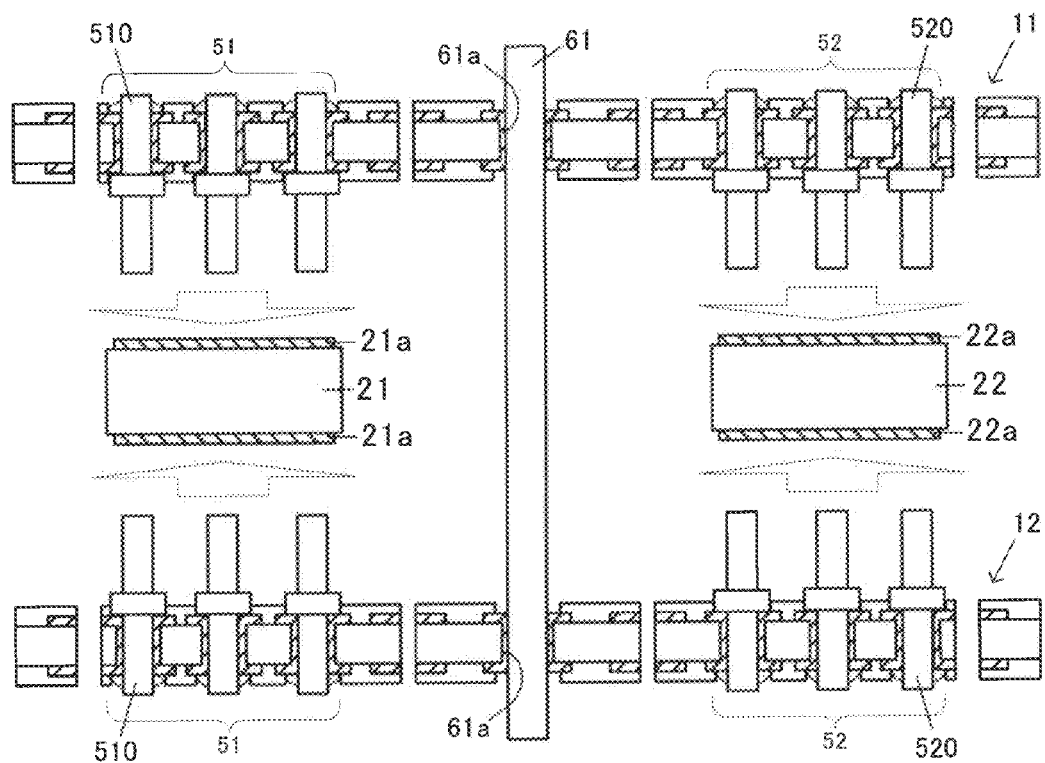
FIG. 14A is a cross-sectional view illustrating a process for mounting a semiconductor chip on a printed wiring board in the manufacturing method according to the same embodiment.

Next, as shown in FIG. 14A, the semiconductor chips 21 and 22 are prepared as electronic components to be mounted, and the printed wiring boards 11 and 12 are aligned with each other such that the printed wiring boards are disposed opposite to each other with the semiconductor chips 21 and 22 interposed therebetween. In addition, the columns 61 to 63 are inserted into the through-holes 61a to 63a (refer to FIG. 1). Next, the columns 61 to 63 are guided and the positional relationships thereof are maintained, and the printed wiring boards 11 and 12 are made approach from both sides (front and rear sides) of the semiconductor chips 21 and 22. The electrodes 21a and 22a of the semiconductor chips 21 and 22 and the end faces of the rear ends 512a of the conductor posts 510 and 520 come into contact with each other, and in this state, the electrodes and the end faces are soldered (refer to FIG. 7). The connection method that is used to connect the conductor posts and the semiconductor chips is not limited to solder bonding, and may be metal bonding, such as, for example, bonding between coppers.

Figure 14B:
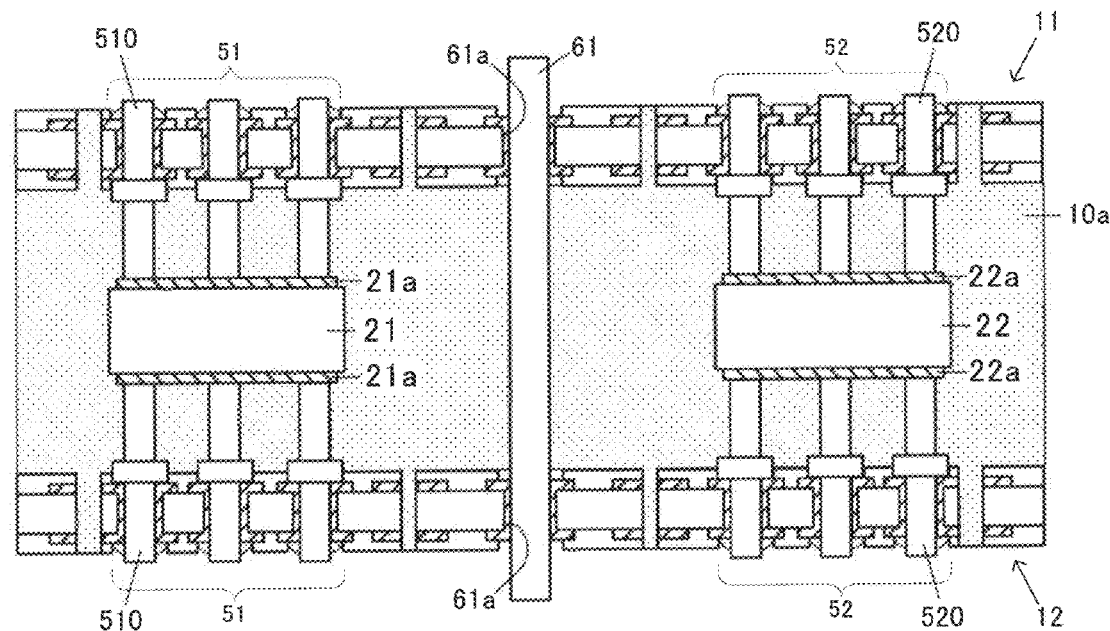
FIG. 14B is a cross-sectional view illustrating a process for filling an insulating resin (sealing process) in the manufacturing method according to the same embodiment.

Next, as shown in FIG. 14B, the insulating resin 10a is filled between the printed wiring boards 11 and 12. At this time, for example, it is possible to inject the insulating resin 10a through the point-like through-holes 81 and the slits 82a and 82b. As a result, the semiconductor chips 21 and 22 are covered by the insulating resin 10a and then sealed. In this way, the semiconductor device 10 is finished.

Second Embodiment

Next, a second embodiment of the present invention will be described. In this embodiment, a portion that is different from the first embodiment is mainly described.

In the second embodiment, when connecting the leg portions 512 of the conductor posts 510 and 520 and the semiconductor chips 21 and 22, fused solder is adhered to the leg portions 512 of the conductor posts 510 and 520, and then the semiconductor chips 21 and 22 make contact with the fused solder. After that, by curing the fused solder, the leg portions 512 of the conductor posts 510 and 520 and the semiconductor chips 21 and 22 are connected.

Figure 15A:
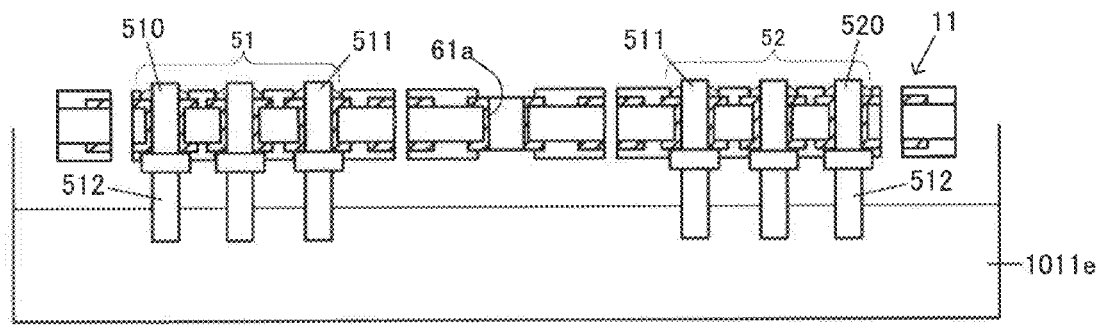
FIGS. 15A-15B are cross-sectional views illustrating an outline of a method for manufacturing a semiconductor device according to a second embodiment of the present invention.
Figure 15B:
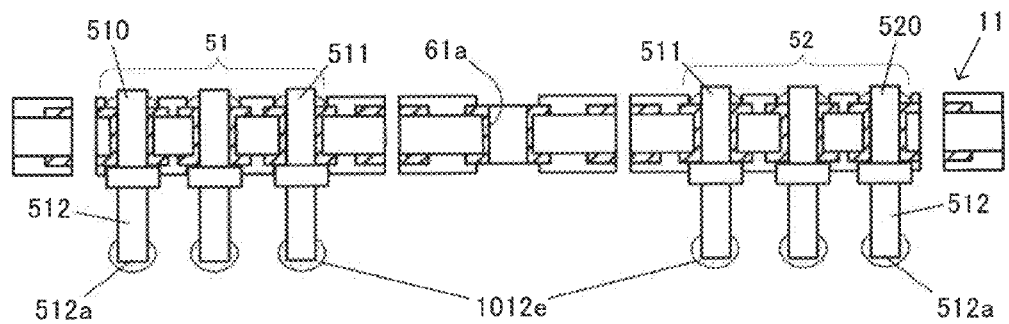

Specifically, for example, in a process shown in FIG. 13B, the printed wiring boards 11 and 12 are completed before the semiconductor chips are mounted; after that, as shown in FIG. 15A, in each of the printed wiring boards 11 and 12, only the tip of the leg portions of the conductor posts 510 and 520 are immersed in solder bath 1011e at approximately "200° C." for a predetermined time. Next, as shown in FIG. 15B, the fused solder 1012e is adhered to the rear ends 512a of the leg portions 512 of the conductor posts 510 and 520. After that, in substantially the same process shown in FIG. 14A, the semiconductor chips 21 and 22 are arranged close to the printed wiring boards 11 and 12 so as to make contact with the fused solder 1012e. Then, by lowering the temperature until the fused solder 1012e is cured, the leg portions 512 of the conductor posts 510 and 520 are connected to the semiconductor chips 21 and 22 (refer to FIG. 7). The processes after that are the same as in the first embodiment. According to such a manufacturing method, excellent electrical and physical connections are achieved between the conductor posts 510 and 520 and semiconductor chips 21 and 22. Namely, excellent electrical characteristics will be obtained, while their connections become firm. Instead of solder bath 1011e, metal paste may also be used.

Third Embodiment

Next, a third embodiment of the present invention will be described. In this embodiment, a portion that is different from the first embodiment is mainly described.

Figure 16:
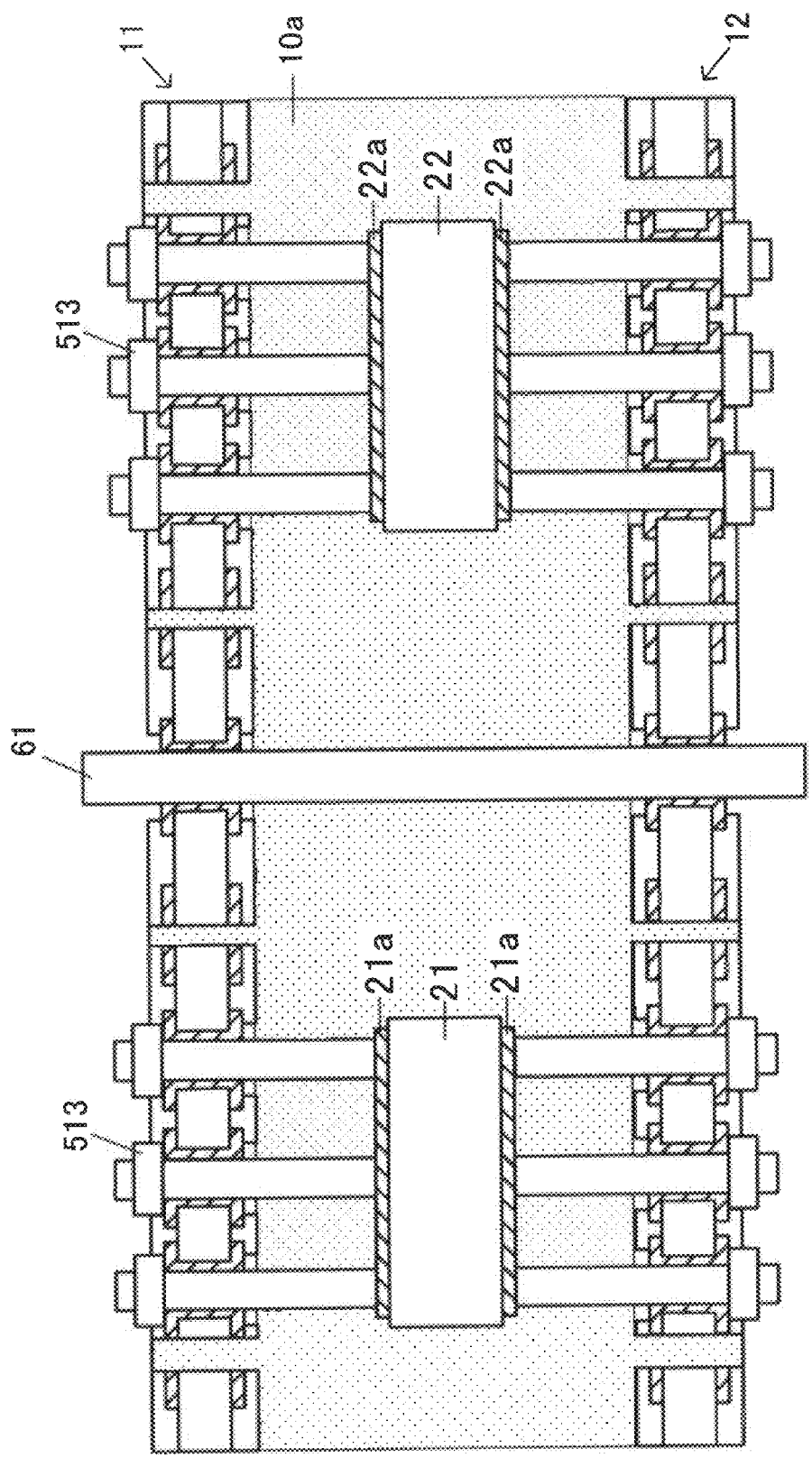
FIG. 16 is a cross-sectional view illustrating an outline of a semiconductor device according to a third embodiment of the present invention.

FIG. 16 is a cross-sectional view illustrating a third embodiment of the present invention. In the third embodiment, the leg portion 512 of the conductor post 510 is inserted into the through-hole 101a that is provided in the printed wiring board 11. That is, the printed wiring board 11 and the second surface of the flange portion 513 (the bottom surface 512b of the flange portion 513) of the conductor post 510 shown in FIG. 4B come into contact with each other.

Further, the head portion 511 in the third embodiment is a portion of the conductor post 510 that protrudes from the first surface of the flange portion 513 (the top surface 513a of the flange portion 513). The leg portion 512 is a portion of the conductor post that protrudes from the second surface of the flange portion 513 (the bottom surface 512b of the flange potion 513). In addition, for example, the second surface of the flange portion 513 indicates a surface where the flange portion 513 comes into contact with the printed wiring board, and the first surface thereof indicates a surface that is opposite to the second surface, as shown in FIG. 16.

In the semiconductor device 10, since the conductor post and the through-hole conductor are directly connected to each other, the conductor post can be suppressed from being removed or cracks, and excellent connection, which can maintain connection having high reliability over a long period, is obtained as electric connection between the conductor post and the through-hole conductor. In addition, since the conductor post has the flange portion, the flange portion functions as a stopper and a positioning guide. For this reason, a positional precision of the conductor post can be increased and a positional deviation between the conductor posts can be decreased.

Further, the above embodiment may be embodied after the above embodiment is changed as follows.

Figure 17:
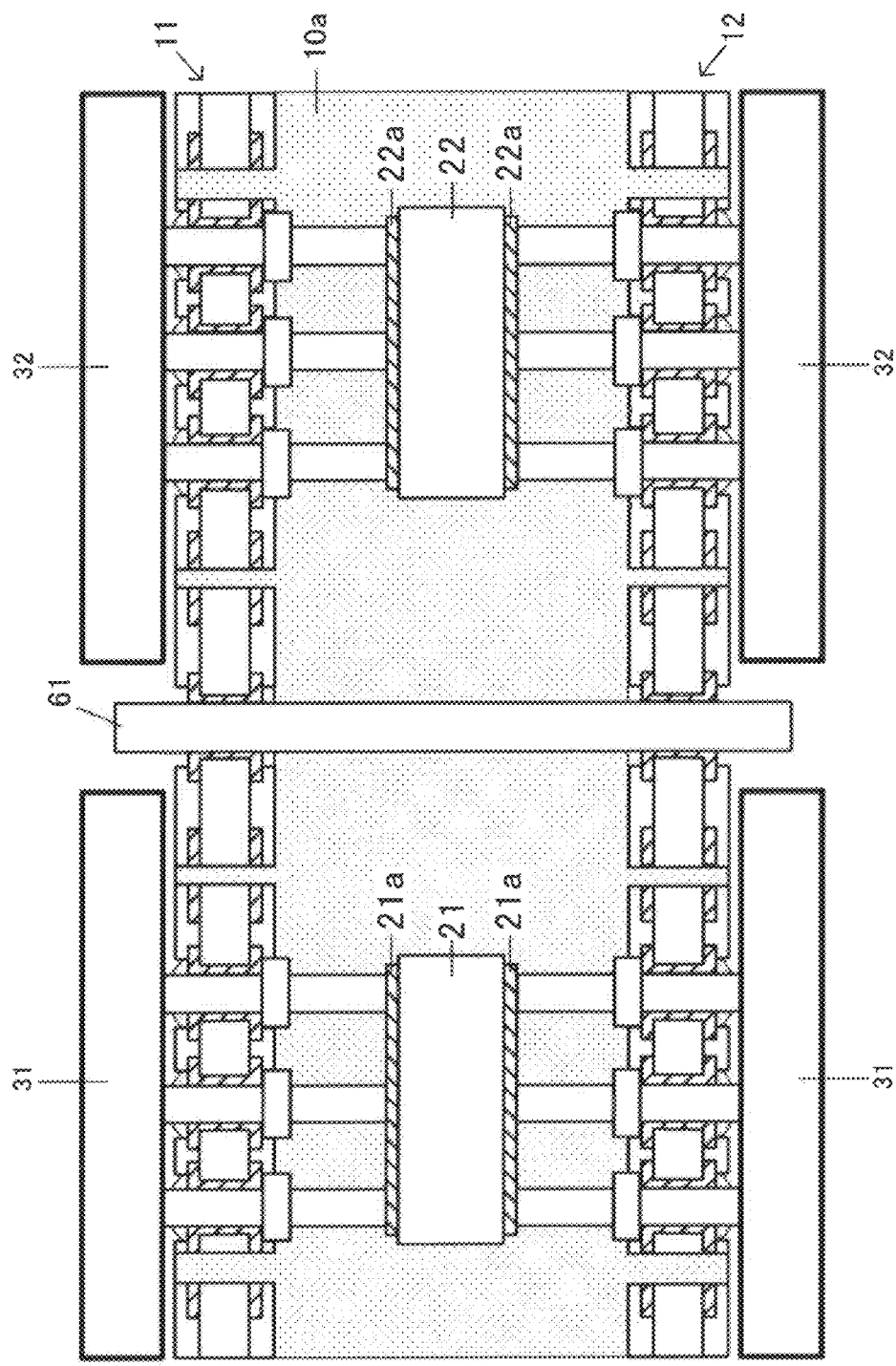
FIG. 17 is a cross-sectional view illustrating a semiconductor device that includes a heat waster, which is a modification of a semiconductor device according to the present invention.

For example, as shown in FIG. 17, heat wasters 31 and 32 may be mounted on the front ends 511a (one end that is inserted into the through-hole) of the conductor posts 510 and 520. In this way, it is possible to improve a heat dissipation effect. Further, as each of the heat wasters 31 and 32, a flat heat sink, which is made of, for example, AlN (aluminum nitride), may be used. FIG. 17 shows an example where the heat wasters are provided in all the front ends 511a. However, the heat waster may be provided in only an arbitrary front end 511a.

Figure 18:
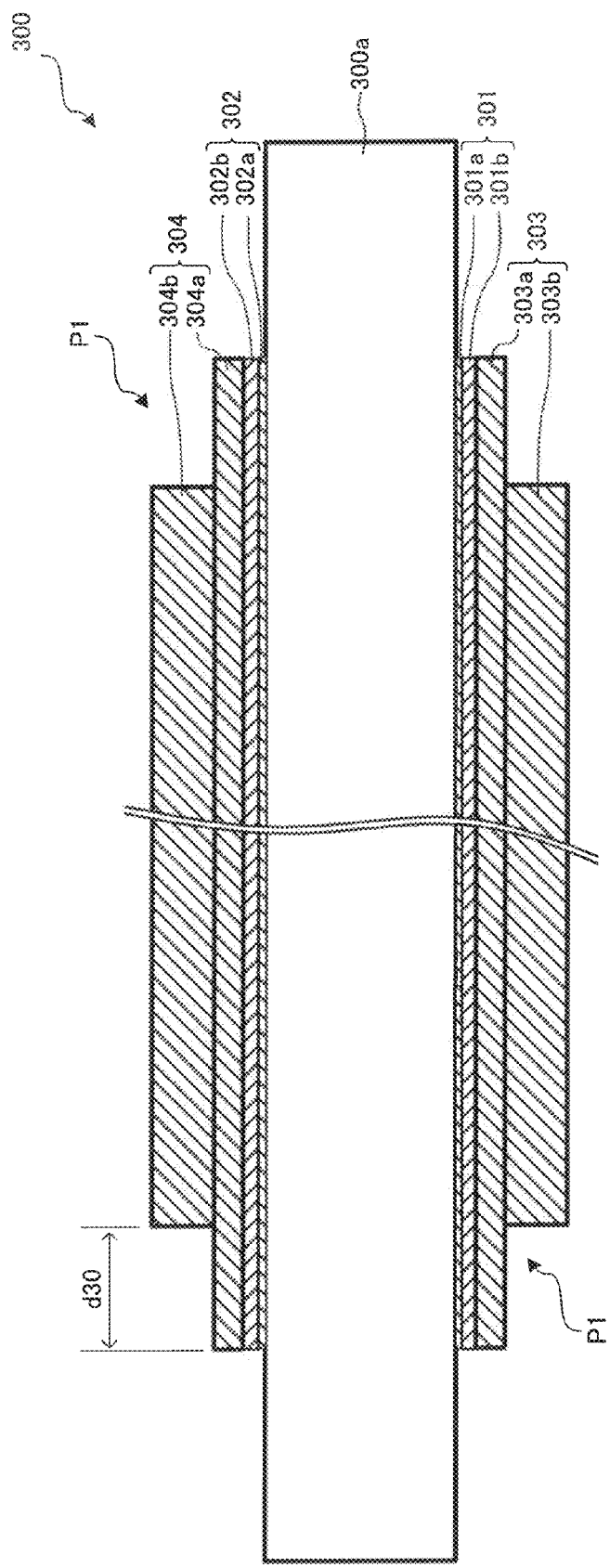
FIG. 18 is a cross-sectional view illustrating an example of a heat waster.

As for the heat wasters 31 and 32, for example, a heat waster 300 shown in FIG. 18 is effective. The heat waster 300 has a ceramic board 300a, base layers 301 and 302, and metal layers 303 and 304. Those are configured to be a rectangular plate, for example.

On the bottom surface of the ceramic board 300a, base layer 301 and metal layer 303 are laminated in that order. Meanwhile, on the top surface of the ceramic board 300a, the base layer 302 and the metal layer 304 are laminated in that order.

The ceramic board 300a is made of, for example, AlN (aluminum nitride) or the like with a thickness of 0.635 mm, and is insulative. The ceramic board 300*a* insulates the top and bottom surfaces, while conveying heat in a highly efficient manner.

The base layer 301 is formed with first and second base layers 301*a* and 301*b*. Also, the base layer 302 is formed with first and second base layers 302*a* and 302*b*. The first base layers 301*a* and 302*a* are each made of titanium (Ti) with a thickness of 0.1 μm, for example. In addition, the second base layers 301*b* and 302*b* are each made of copper (Cu) with a thickness of 1.0 μm, for example.

The metal layer 303 is formed with first and second metal layers 303*a* and 303*b*. Also, the metal layer 304 is formed with first and second metal layers 304*a* and 304*b*. The first metal layers 303*a* and 304*a* are each made of copper-plated film with a thickness of 20 μm, for example. In addition, the second metal layers 303*b* and 304*b* are each made of copper-plated film with a thickness of 80 μm, for example. The four sides of the second metal layers 303*b* and 304*b* are shorter, for example, by 0.1-1.0 mm than their corresponding sides of the first metal layers 303*a* and 304*a* (dimensional differences d30 in FIG. 18=0.1-1.0 mm). Namely, on the side surfaces of the metal layers 303 and 304, steps P1 are formed. Accordingly, stress caused by the different thermal expansion coefficients or the like between the ceramic board 300*a* and metal layers 303 and 304 is relieved and cracks or the like are suppressed from occurring.

The heat waster 300 is manufactured by the processes shown in FIGS. 19A to 21C (each illustrating a cross-sectional view corresponding to its respective portion shown in FIG. 18), for example.

Figure 19A:
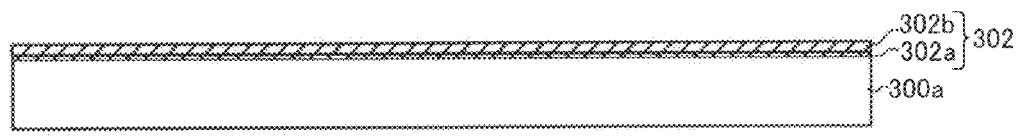
FIG. 19A is a view illustrating a first process for manufacturing a heat waster.

First, as shown in FIG. 19A, by sputtering, for example, using argon plasma under the conditions of DG 4-5 kW and time 5-15 minutes, the first base layer 302*a* made of 0.1 μm-thick titanium and the second base layer 302*b* made of 1.0 μm-thick copper are formed in that order on the top surface of the ceramic board 300*a*. As a result, the base layer 302 is formed. The first and second base layers 302*a* and 302*b* are each formed as a plain pattern.

Figure 19B:
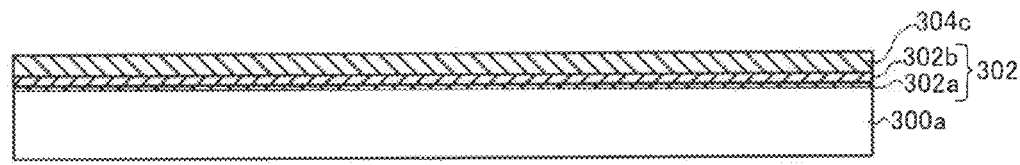
FIG. 19B is a view illustrating a second process for manufacturing a heat waster.

Next, as shown in FIG. 19B, for example, on the entire top surface of the base layer 302, electrolytic plated film 304*c* is formed. Specifically, for example, by immersing the ceramic board 300*a* in a copper sulfate solution using the ceramic board 300*a* as a cathode and a copper electrode as an anode, electrolytic copper plating is performed with current density at 3 A/dm$^2$ for 30 minutes.

Figure 20A:
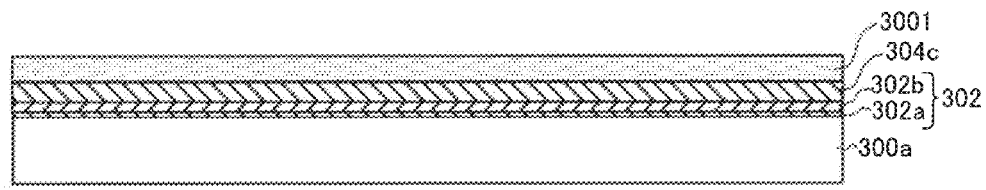
FIG. 20A is a view illustrating a third process for manufacturing a heat waster.

Next, as shown in FIG. 20A, for example, a dry film 3001 is laminated to cover the entire top surface of the electrolytic plated film 304*c*. The dry film 3001 is a negative-type photoresist, for example.

Figure 20B:
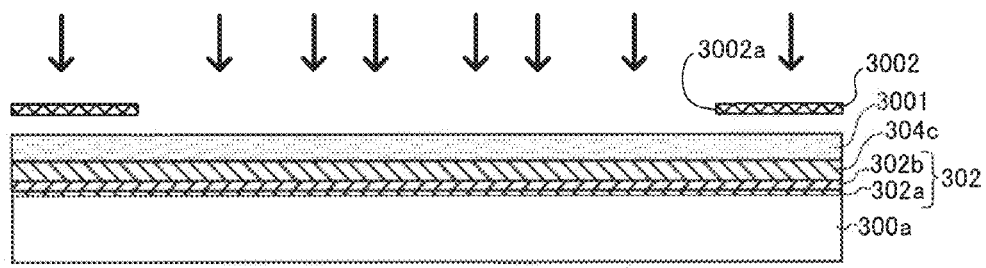
FIG. 20B is a view illustrating a fourth process for manufacturing a heat waster.

Next, as shown in FIG. 20B, a mask 3002 having an opening portion 3002*a* that corresponds to a circuit pattern is placed on the top-surface side of the dry film 3001, and the dry film 3001 is exposed to light from its top-surface side. As a result, the area in the opening portion 3002*a* of the dry film 3001 is exposed to light.

Figure 20C:
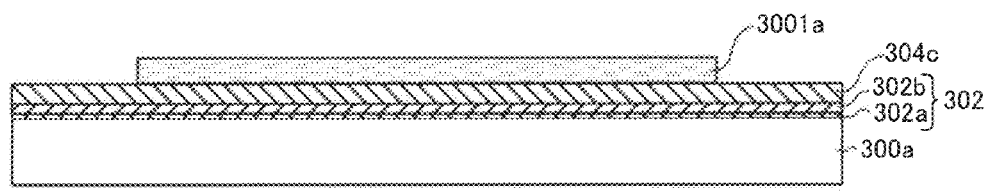
FIG. 20C is a view illustrating a fifth process for manufacturing a heat waster.

Next, as shown in FIG. 20C, by developing for a few minutes, for example, the unexposed portion of the dry film 3001 is dissolved. As for a developing solution, for example, a sodium carbonate solution is used. As a result, the exposed portion 3001*a* of the dry film remains on the top surface of the electrolytic plated film 304*c*.

Figure 20D:
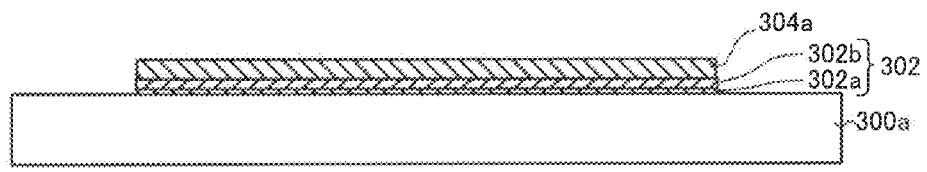
FIG. 20D is a view illustrating a sixth process for manufacturing a heat waster.

Next, the portion of the electrolytic plated film 304*c*, which is not covered by the exposed portion 3001*a* of the dry film, is removed by etching, for example. As for an etchant, a mixed solution of copper chloride and hydrochloric acid is used, for example. After that, the exposed portion 3001*a* of the dry film is removed using acetone, while applying ultrasonic waves to the board. As a result, as shown in FIG. 20D, for example, the first metal layer 304*a* is formed on the top surface of the base layer 302.

Figure 21A:
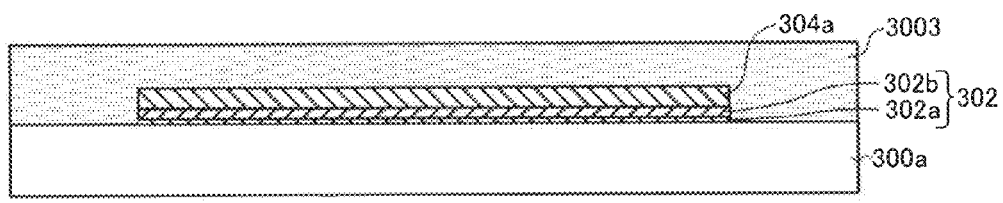
FIG. 21A is a view illustrating a seventh process for manufacturing a heat waster.

Next, as shown in FIG. 21A, for example, a dry film 3003 is laminated to cover the first metal layer 304*a*. The dry film 3003 is, for example, a positive-type photoresist.

Figure 21B:
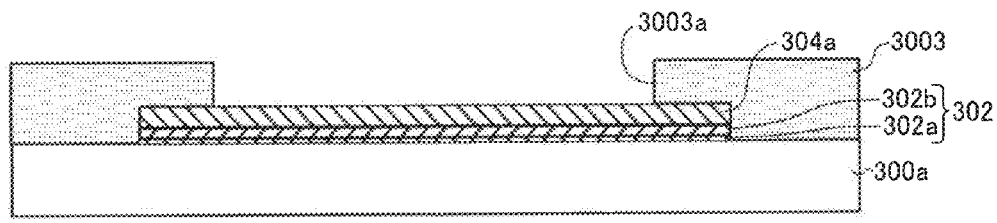
FIG. 21B is a view illustrating an eighth process for manufacturing a heat waster.

Next, as shown in FIG. 21B, an opening portion 3003*a* is formed on the exposed portion of the dry film 3003 by exposure and development the same as described above.

Figure 21C:
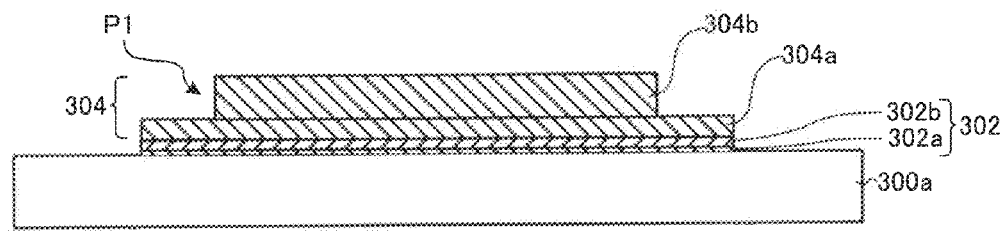
FIG. 21C is a view illustrating a ninth process for manufacturing a heat waster.

Next, the second metal layer 304*b* is formed in the opening portion 3003*a* of the dry film 3003. As a result, the second metal layer 304*b* is formed on the top surface of the first metal layer 304*a*. Specifically, for example, by immersing the ceramic board 300*a* in a copper sulfate solution using the ceramic board 300*a* as a cathode and a copper electrode as an anode, electrolytic copper plating is performed with current density at 3 A/dm$^2$ for two hours. After that, the dry film 3003 is removed using acetone, for example, while applying ultrasonic waves to the board. Furthermore, a thermal treatment is conducted under a nitrogen atmosphere at 350° C. for an hour. As a result, as shown in FIG. 21C, for example, on the top surface of the ceramic board 300*a*, the metal layer 304 is formed having steps P1 on both of its sides.

Also, following the same processes, the base layer 301 and the metal layer 303 are laminated in that order on the bottom surface of the ceramic board 300*a*. By forming the base layers 301 and 302 and the metal layers 303 and 304 on both surfaces of the ceramic board 300*a*, the heat waster 300 is completed as shown in FIG. 18.

In an example shown in FIGS. 19A to 21C, the patterned first metal layer 304 is formed by selectively etching after a metal film is laminated on the entire surface. However, the present embodiment is not limited to such. For example, by selectively laminating a metal film, a patterned first metal layer 304*a* may be formed.

Figure 22A:
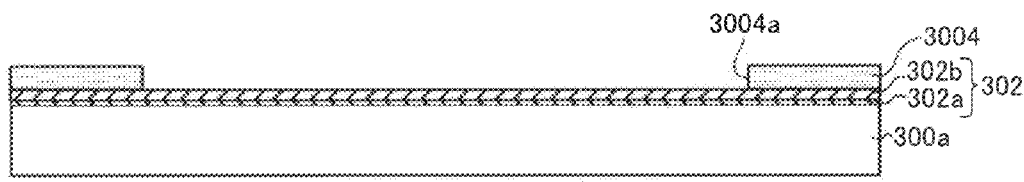
FIG. 22A is a view illustrating a first process of another method for manufacturing a heat waster.

In such a case, for example, after the processes shown in FIGS. 19A and 19B, a dry film 3004 is laminated on the top surface of a base layer 302, which is exposed to light and developed to make a pattern. As a result, as shown in FIG. 22A, for example, an opening portion 3004*a* is formed in the exposed portion of the dry film 3004. The dry film 3004 is a positive-type photoresist, for example.

Figure 22B:
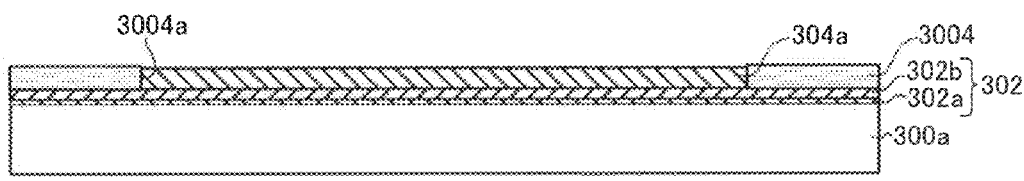
FIG. 22B is a view illustrating a second process of another method for manufacturing a heat waster.

Next, as shown in FIG. 22B, for example, a first metal layer 304*a* is formed on the opening portion 3004*a* of the dry film 3004.

Figure 22C:
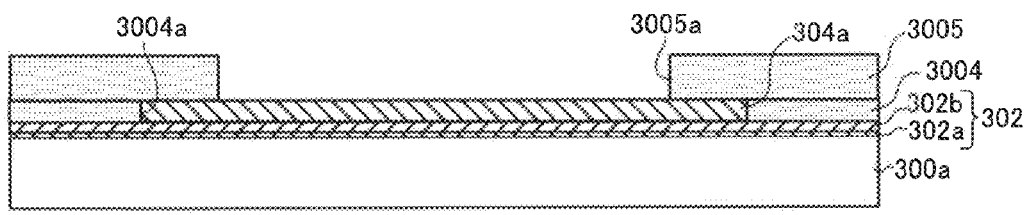
FIG. 22C is a view illustrating a third process of another method for manufacturing a heat waster.

Next, a dry film 3005 is laminated on the top surface of the dry film 3004 and the first metal layer 304*a*, and is exposed to light and developed to make a pattern. As a result, as shown in FIG. 22C, for example, an opening portion 3005*a* is formed in the exposed portion of the dry film 3005. The dry film 3005 is a positive-type photoresist, for example.

Figure 22D:
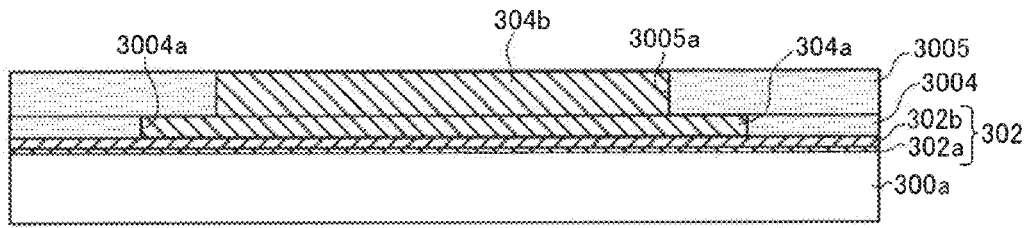
FIG. 22D is a view illustrating a fourth process of another method for manufacturing a heat waster.

Next, as shown in FIG. 22D, for example, a second metal layer 304*b* is formed in the opening portion 3005*a* of the dry film 3005. After that, by removing the dry films 3004 and 3005, and conducting a thermal treatment according to requirements, a metal layer 304 is formed having steps P1 on the top surface of the ceramic board 300*a*.

Figure 23:
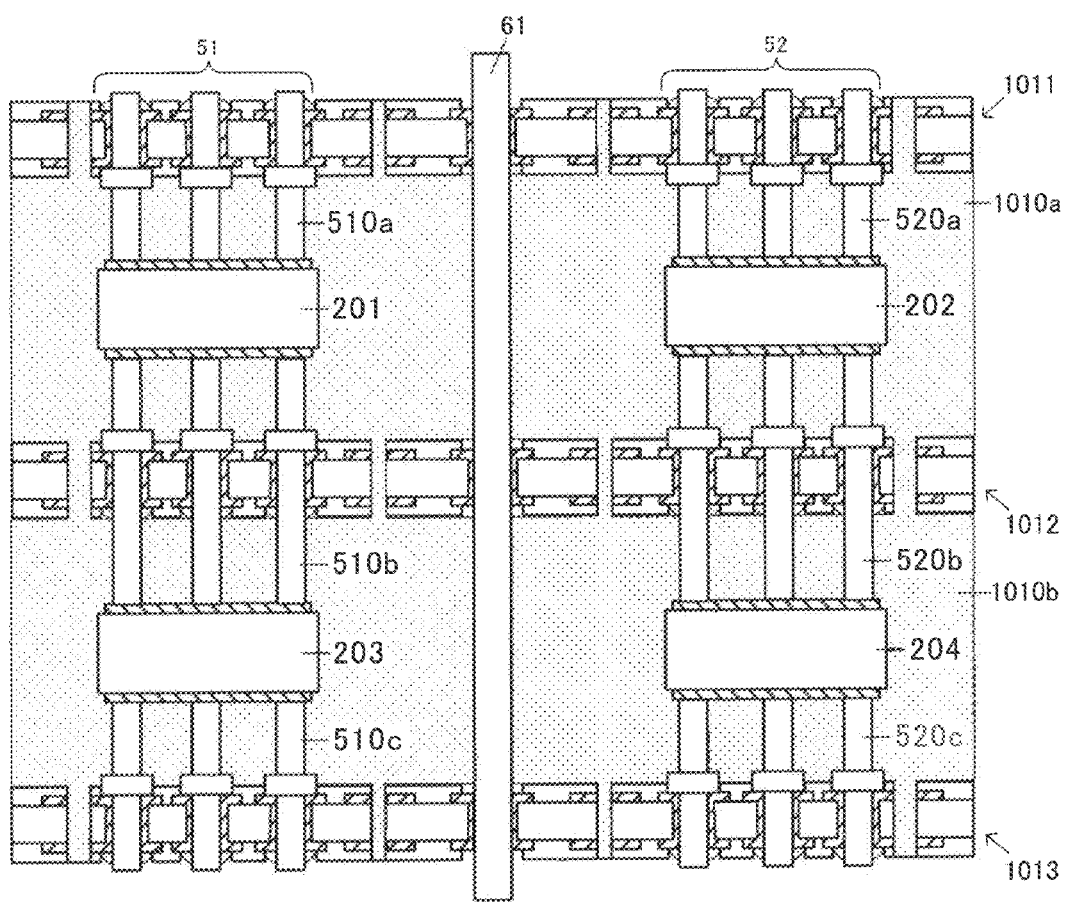
FIG. 23 is a cross-sectional view illustrating a semiconductor device that includes three or more printed wiring boards, which is a modification of a semiconductor device according to the present invention.

For example, as shown in FIG. 23, three or more printed wiring boards may be connected. The semiconductor device that is shown in FIG. 23 has three wiring boards that have the same structure as the printed wiring board 11, that is, a first wiring board 1011, a second wiring board 1012, and a third wiring board 1013. In the conductor posts 510*a* and 520*a* of the first wiring board 1011 and the conductor posts 510*b* and 520*b* of the second wiring board 1012, common semiconductor chips 201 and 202 are mounted. In addition, in the conductor posts 510*b* and 520*b* of the second wiring board 1012 and the conductor posts 510*c* and 520*c* of the third wiring board 1013, common semiconductor chips 203 and 204 are mounted. The first wiring board 1011 and the second wiring board 1012 are disposed opposite to each other such that they interpose the semiconductor chips 201 and 202 therebetween. Meanwhile, the second wiring board 1012 and the third wiring board 1013 are disposed opposite to each other such that they interpose the semiconductor chips 203 and 204 therebetween. The insulating resin 1010*a* is filled between the first wiring board 1011 and the second wiring board 1012 to cover the semiconductor chips 201 and 202. In addition, the insulating resin 1010*b* is filled between the second wiring board 1012 and the third wiring board 1013 to cover the semiconductor chips 203 and 204. In this way, the three printed wiring boards are connected through the conductor posts in the board thickness direction. Even in this case, the heat waster 300 (FIG. 18) may be mounted on a front end of an arbitrary conductor post that is exposed from the solder resist.

In the above embodiment, the printed wiring board that is connected to the semiconductor chip is arranged on both surfaces of the semiconductor chip, but the present invention is not limited thereto. For example, as shown in FIG. 24, the printed wiring board 11 may be provided on only one surface of the semiconductor chips 21 and 22. In this case, in order to improve a heat dissipation effect, as shown in FIG. 24, it is preferable that the heat wasters 33 and 34 be directly mounted on the electrodes 21*a* and 22*a* of the semiconductor chips 21 and 22. In this example, the electrodes 33*a* and 34*a* of the heat wasters 33 and 34 and the electrodes 21*a* and 22*a* of the semiconductor chips 21 and 22 are electrically connected to each other by solders 33*b* and 34*b*. The connection method that is used to connect the heat wasters 33 and 34 may be arbitrary. In addition, as each of the heat wasters 33 and 34, for example, the heat waster 300 (FIG. 18) is effective.

In the above embodiment, the description has been given to the case where the multiple conductor posts are connected to one semiconductor chip, but the present invention is not limited thereto. The number of conductor posts that are connected to the semiconductor chip may be arbitrary. However, when the semiconductor chip is a power system module, it becomes important to improve a heat dissipation effect by connecting the multiple conductor posts to the semiconductor chip.

The kinds of electronic components may be arbitrary. For example, the electronic component may be an electronic component other than a power system semiconductor element. As this electronic component, in addition to an active component, such as an IC circuit, an arbitrary electronic component, such as, for example, a resistor, a capacitor, or a coil, which is a passive component, may be used.

Figure 25A:
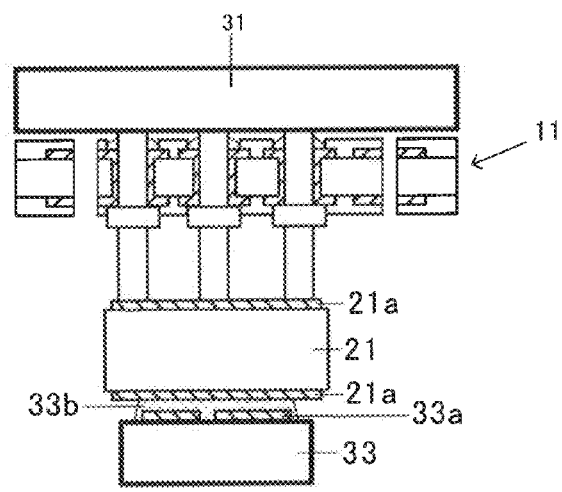
FIG. 25A is a cross-sectional view illustrating a semiconductor device that includes only one semiconductor chip, which is a modification of a semiconductor device according to the present invention.
Figure 25B:
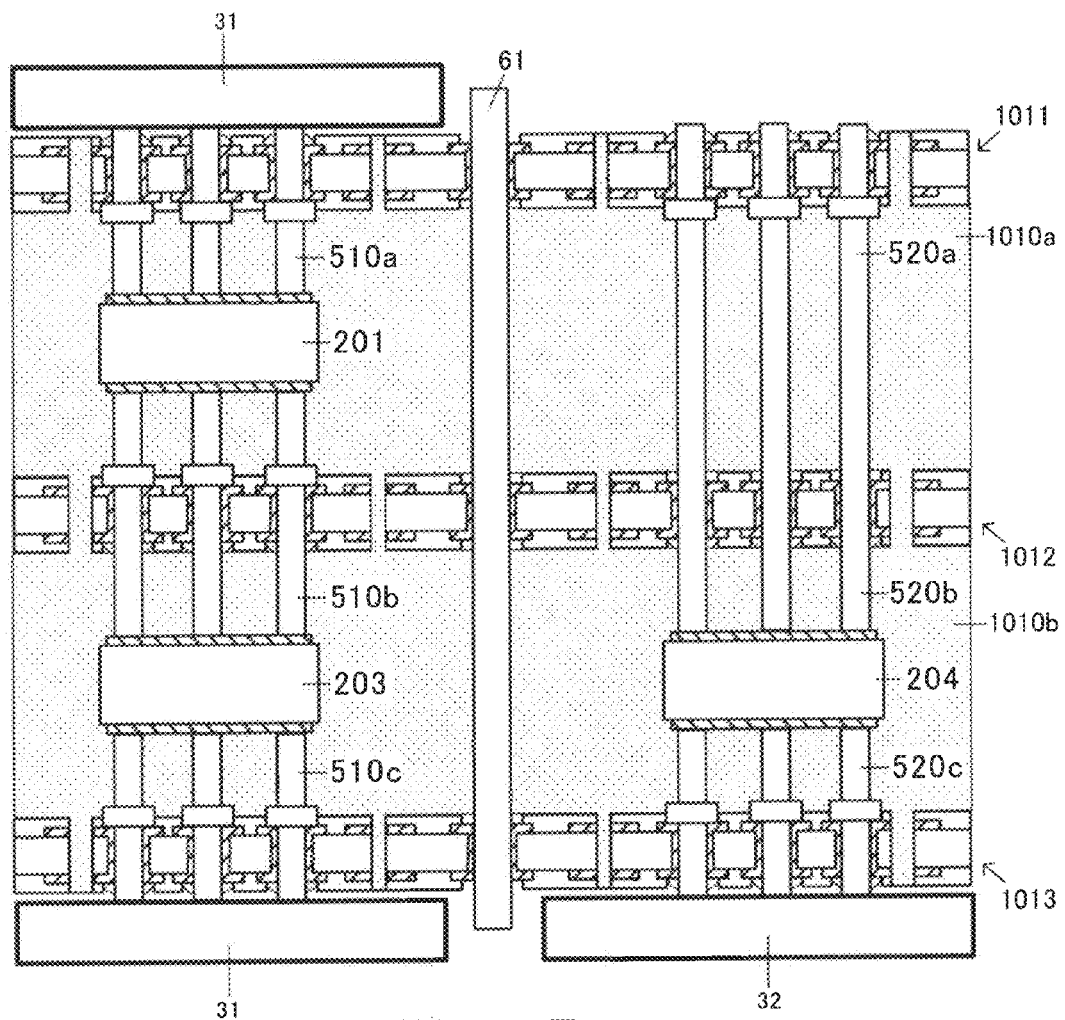
FIG. 25B is a cross-sectional view illustrating a semiconductor device that includes three semiconductor chips, which is a modification of a semiconductor device according to the present invention.

The number of electronic components may also be arbitrary. For example, the number of electronic components may be one (semiconductor chip 21) as shown in FIG. 25A, and may be three (semiconductor chips 201, 203, and 204) as shown in FIG. 25B. In the above embodiment, a symmetrical structure is used, but an asymmetrical structure may be used, as shown in FIG. 25B. In addition, the number of heat wasters may be determined on the basis of the number of electronic components. That is, as the example that is shown in FIG. 25B, heat wasters of the predetermined number (for example, one) may be attached to one electronic component.

Figure 26:
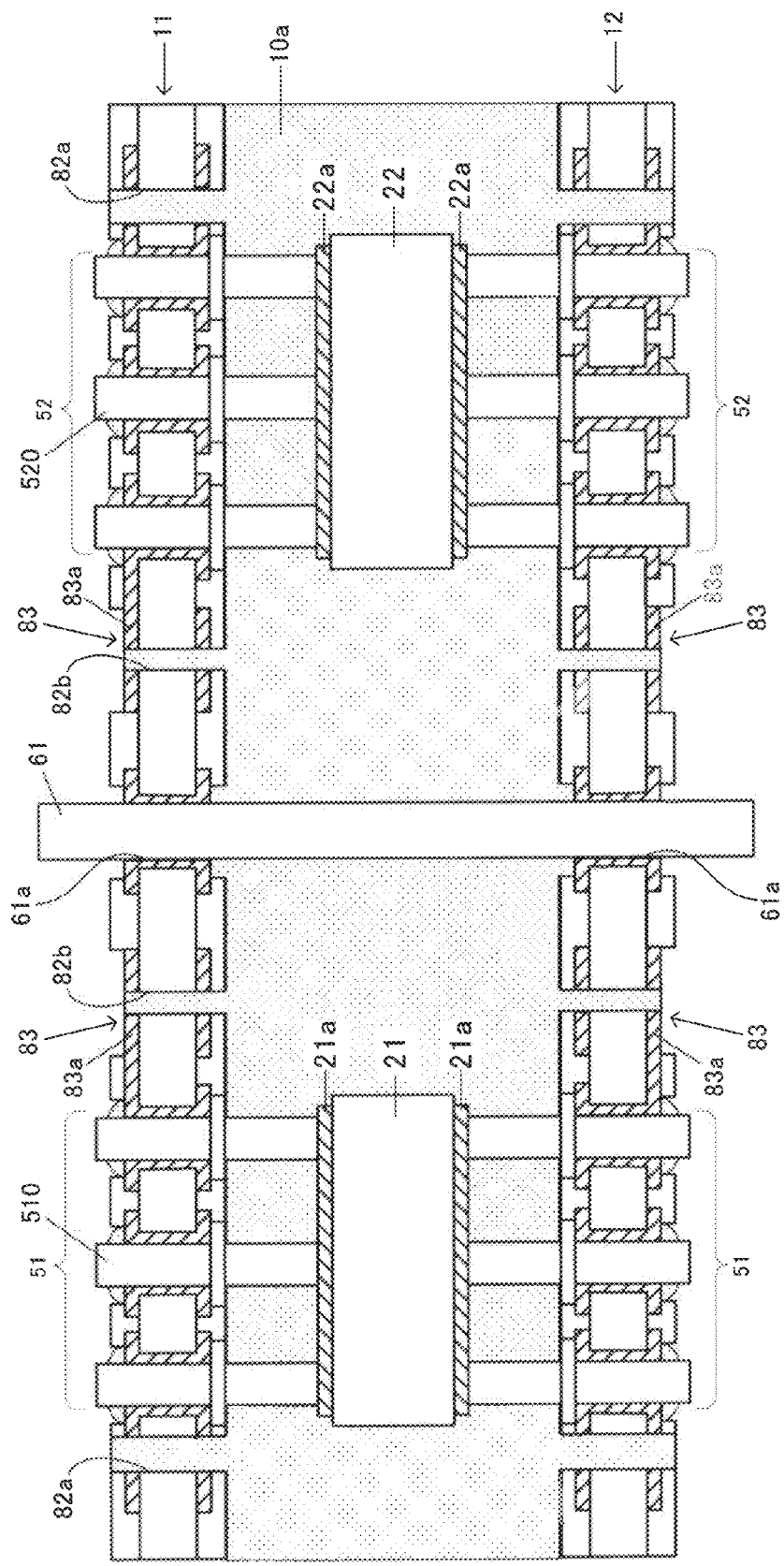
FIG. 26 is a cross-sectional view illustrating a semiconductor device where a dummy conductor is exposed to an area adjacent to a through-hole, which is a modification of a semiconductor device according to the present invention.

For example, as shown in FIG. 26, a dummy conductor (conductor pattern) 83*a* that is electrically connected to the conductor posts 510 and 520 (and thermally connected to the conductor posts 510 and 520) may be formed on a top surface (surface opposite to a surface that comes into contact with the flange portion 513) of the printed wiring board 11 and exposed from the solder resist 114 at a predetermined portion. In the example that is shown in FIG. 26, during the normal operation, the irrelevant dummy conductor 83*a* is formed as a portion of the conductor pattern 112, and exposed to an area 83 adjacent to the slit 82*b*. In this way, it is possible to improve a heat dissipation effect. Further, the dummy conductor 83*a* may be exposed to a portion other than the area 83 that is adjacent to the slit 82*b*. For example, the dummy conductor 83*a* may be exposed to the area 82*a* that is adjacent to the slit 82*a* or the point-like through-hole 81 and an arbitrary portion in the top surface of the printed wiring board 11.

In addition, during the normal operation, if the irrelevant dummy conductor (solid pattern) is disposed on one side or both sides of the printed wiring board 11 with the same layout (for example, refer to FIG. 1) as that of the point-like through-hole 81 or the slit 82*a*, it is possible to alleviate the board from being bent.

For example, as shown in FIG. 27, the conductor posts 510 and 520 and the columns 61 to 63 may be electrically connected to each other. In this way, it is possible to improve a heat dissipation effect.

Figure 28A:
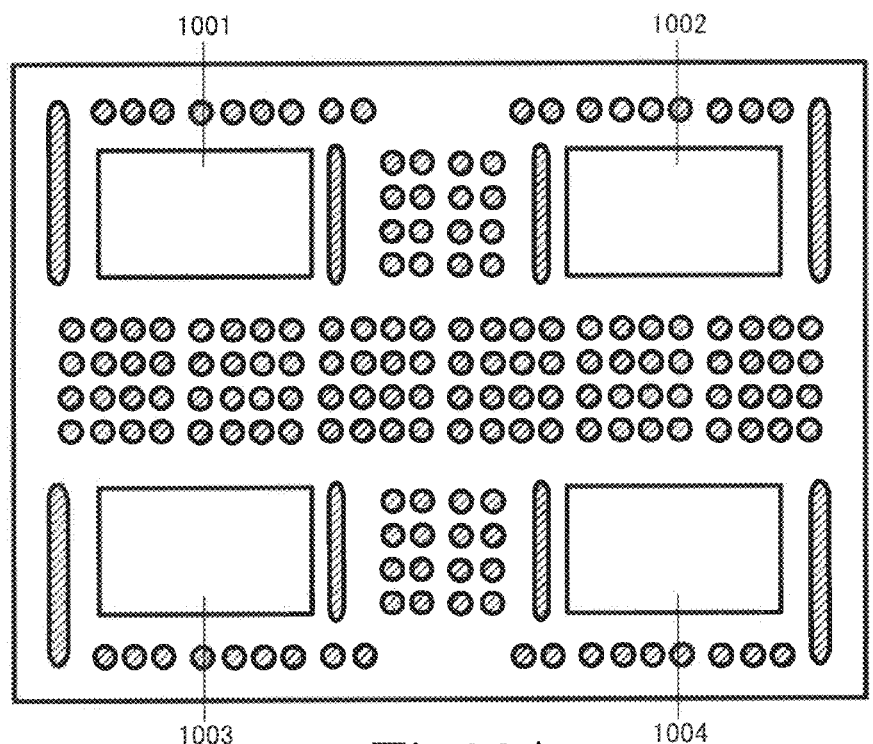
FIG. 28A is a view illustrating the total area of point-like through-holes and linear through-holes.
Figure 28B:
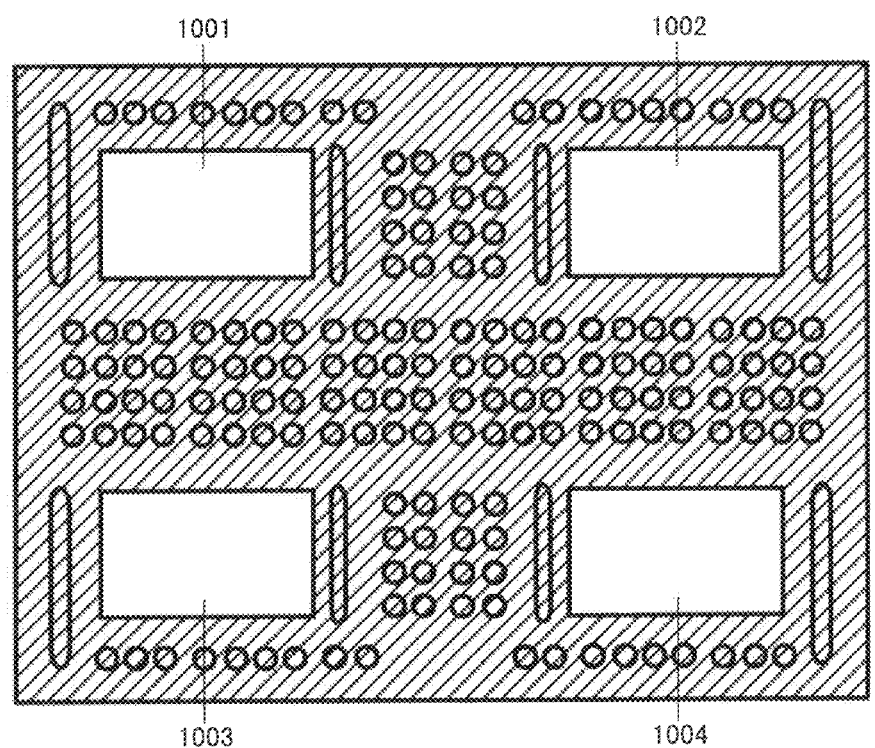
FIG. 28B is a view illustrating an area that still remains after subtracting the total area of a printed wiring board by the area of component mounting areas.

In the printed wiring board, the total area of the point-like through-holes and the linear through-holes (for example, the total area of oblique areas shown in FIG. 28A) preferably occupies at least 5% of an area (for example, an area of oblique areas shown in FIG. 28B), which still remains after subtracting the total area of the printed wiring board by an area of component mounting areas 1001 to 1004 (an area where electronic components are arranged). That is, for example, if the total area of the printed wiring board is "100 (a unit is arbitrary)" and an area of each of the component mounting areas 1001 to 1004 having the same area is "10", 5% of the total area of the oblique areas in FIG. 28B is "(100−4×10)×0.05=3", and the total area of the point-like through-holes and the linear through-holes is preferably "3" or more.

The end face of the front end 511*a* (one end that is inserted into the through-hole) of the conductor post 510 does not necessarily protrude from the top surface of the conductor pattern 112 (copper plating film 112*b*). For example, as shown in FIG. 29, the end face of the front end 511*a* of the conductor post 510 may not protrude according to a utilization purpose.

As shown in FIG. 30, the position of the flange portion 513 of the conductor post 510 may be determined by a combination of the first embodiment and the second embodiment.

The structure of the conductor post 510 is not limited to those shown in FIGS. 4A and 4B and 8A to 8D. The conductor post 510 may have an arbitrary shape as long as the conductor post 510 has a flange portion that protrudes in a radial direction with respect to the columnar shaft.

Figure 31A:
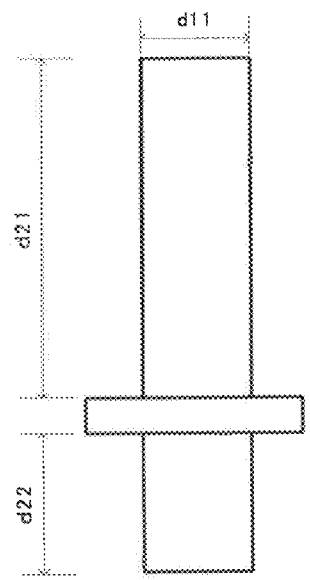
FIGS. 31A-31B are views illustrating conductor posts where a leg portion is shorter than a head portion, which are modifications of a conductor post.
Figure 31B:
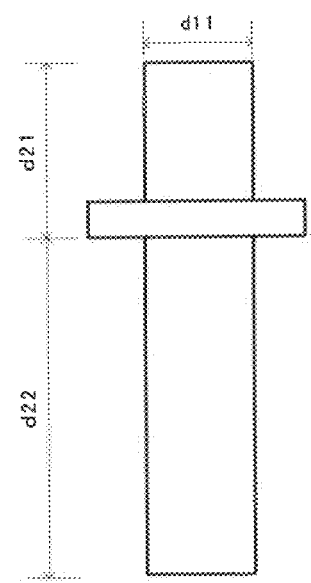

For example, one of the head portion 511 and the leg portion 512 may be longer than the other. For example, as shown in FIG. 31A, the length d22 of the leg portion 512 may be smaller than the length d21 of the head portion 511. Alternatively, as shown in FIG. 31B, the length d22 of the leg portion 512 may be larger than the length d21 of the head portion 511.

Figure 32A:
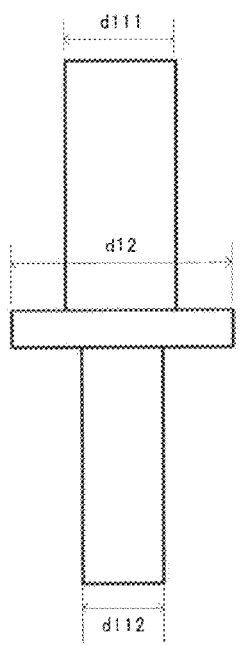
FIGS. 32A-32B are views illustrating conductor posts where a leg portion is thinner than a head portion, which are modifications of a conductor post.
Figure 32B:
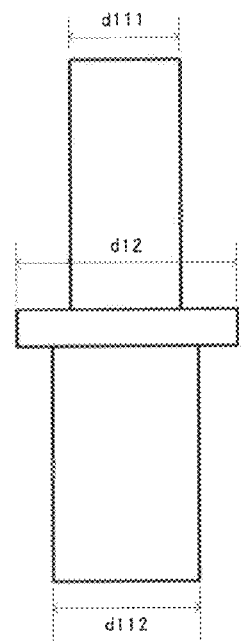

In addition, for example, one of the head portion 511 and the leg portion 512 may be thicker than the other. For example, as shown in FIG. 32A, the thickness (diameter d112 of a horizontal section shape) of the leg portion 512 may be smaller than the thickness (diameter d111 of a horizontal section shape) of the head portion 511. Alternatively, as shown in FIG. 32B, the thickness (diameter d112 of a horizontal section shape) of the leg portion 512 may be larger than the thickness (diameter d111 of a horizontal section shape) of the head portion 511. Even in any case, the diameters d111 and d112 of the horizontal section shapes of the head portion 511 and the leg portion 512 may be smaller than the diameter d12 of the horizontal section shape of the flange portion 513.

Figure 33A:
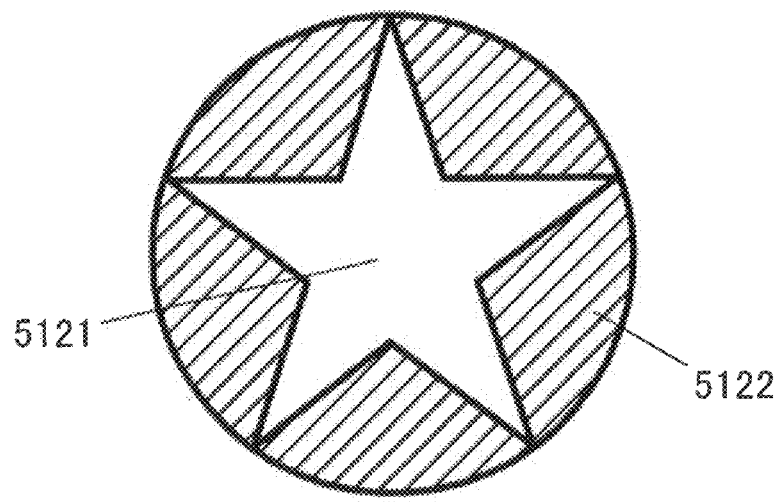
FIGS. 33A-33B are plan views illustrating examples of a form of a connection surface with a semiconductor chip, which are modifications of a conductor post.
Figure 33B:
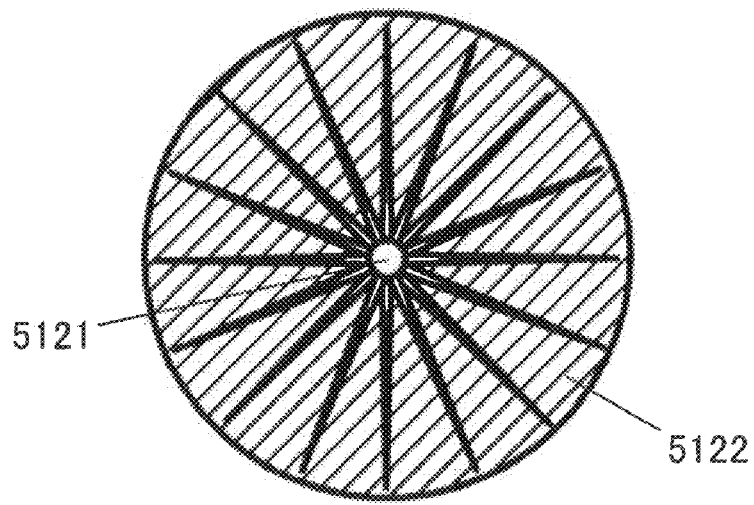

In addition, the form of the rear end 512a (connection surface with a semiconductor chip) of the conductor post 510 may be appropriately changed. For example, as shown in FIG. 33A or 33B, as a section that corresponds to the section shown in FIG. 8B, a section having a multi-radial form may be adopted. That is, as the example that is shown in FIG. 33A, a section having a star-shaped area as a flat area 5121 may be adopted. Alternatively, as the example that is shown in FIG. 33B, a section having multiple linear areas that extend radially from the center of the shaft as the flat area 5121 may be adopted. Even in this case, it is preferable that the craters 5122 be disposed between radiation sides of the flat area 5121 and disposed at equal intervals in a circumferential direction. If the craters 5122 are provided, it is possible to decrease cracks in the rear end portion (connection portion with the semiconductor chip) of the conductor post.

Figure 8A:
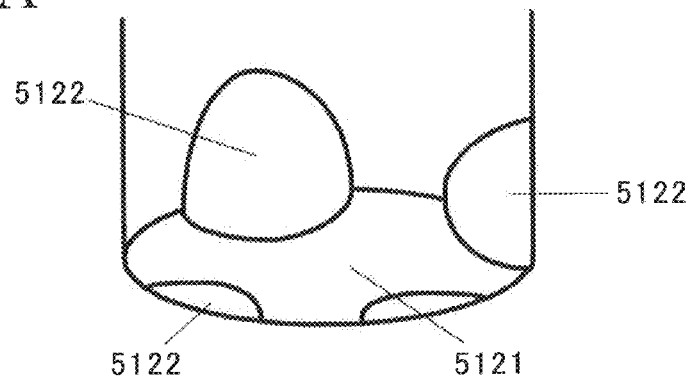
FIG. 8A is a perspective view illustrating a rear end (connection end with a semiconductor chip) of a conductor post.
Figure 8B:
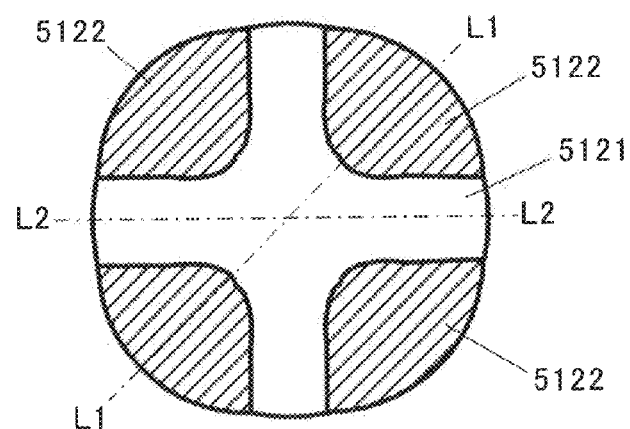
FIG. 8B is a plan view illustrating a rear end (connection end with a semiconductor chip) of a conductor post.
Figure 8C:
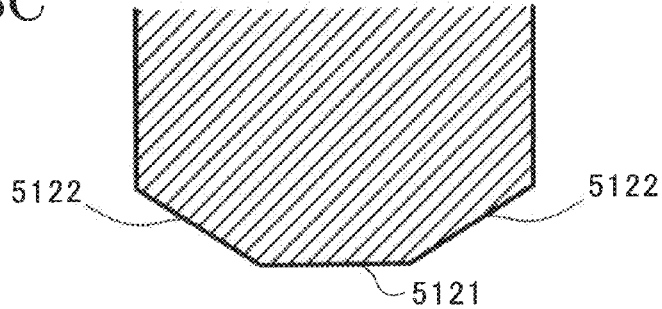
FIG. 8C is a cross-sectional view taken along the line L1-L1 of FIG. 8B.
Figure 8D:
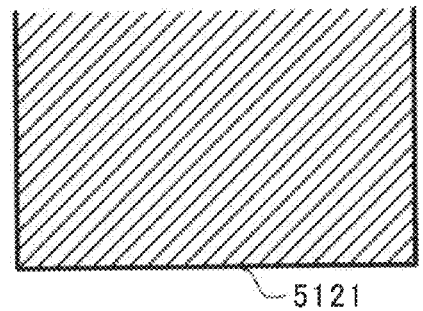
FIG. 8D is a cross-sectional view taken along the line L2-L2 of FIG. 8B.
Figure 34A:
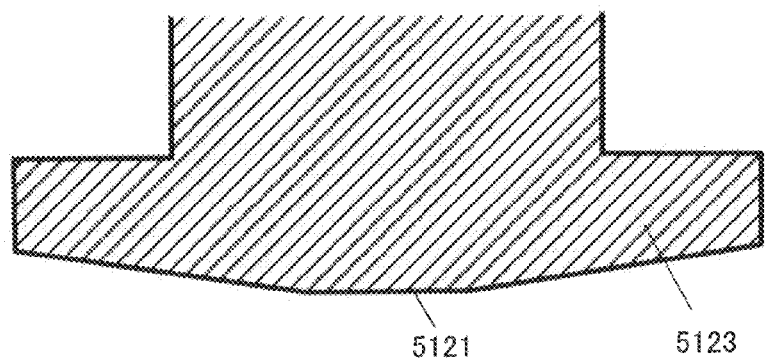
FIGS. 34A-34C are cross-sectional views illustrating examples of a form of a connection surface with a semiconductor chip, which are modifications of a conductor post.
Figure 34B:
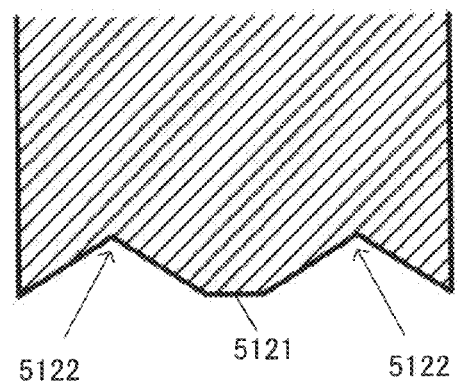
Figure 34C:
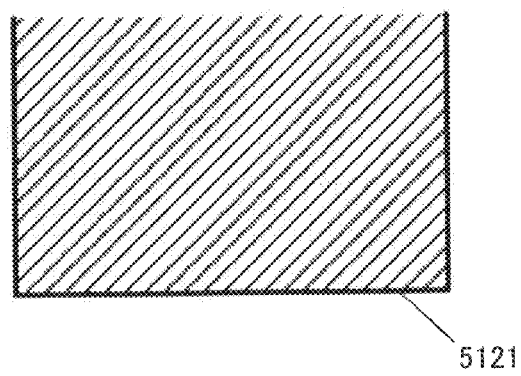

In addition, for example, as a section that corresponds to the section that is shown in FIG. 8C, a section that is shown in FIG. 34A may be adopted. That is, as the example that is shown in FIG. 34A, in order to expand the connection surface with the semiconductor chips 21 and 22, an umbrella portion 5123 that protrudes in a radial direction with respect to the shaft may be formed in the rear end 512a of the conductor post 510. Alternatively, as shown in FIG. 34B, the craters 5122 may be formed at the inner side (that is, closer to the center of the shaft). The craters 5122 are effectively used when decreasing voids or cracks. However, the crater 5122 is not an essential component. For example, as shown in FIG. 34C, if the crater 5122 is not needed, the formation of the crater may be omitted.

Figure 35A:
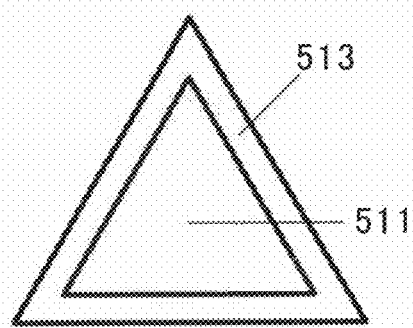
FIGS. 35A-35C are is a plan views illustrating examples of forms of a shaft and a flange portion, which are modifications of a conductor post.
Figure 35B:
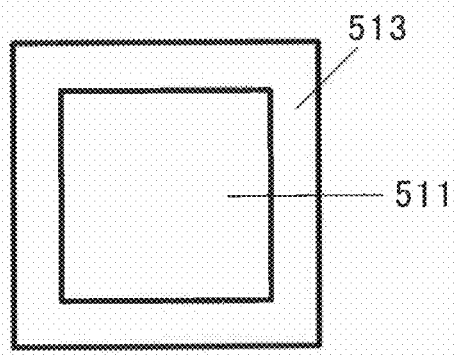
Figure 35C:
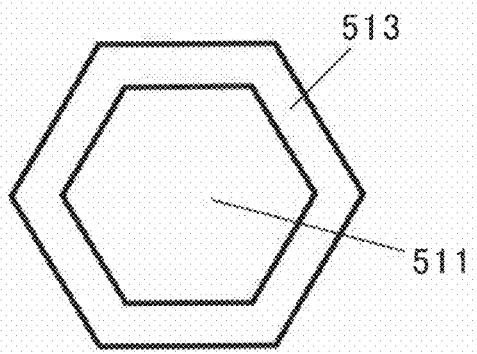
Figure 36A:
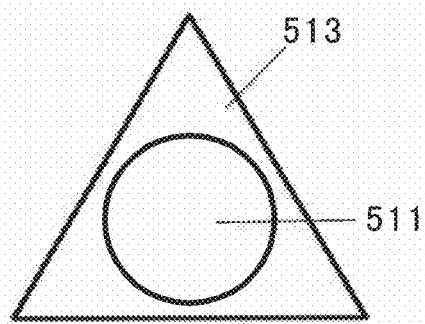
FIGS. 36A-36C are plan views illustrating example of forms of a shaft and a flange portion, which are modifications of a conductor post.
Figure 36B:
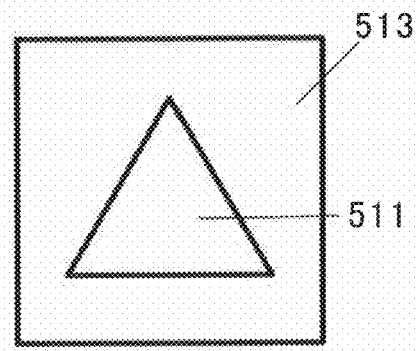
Figure 36C:
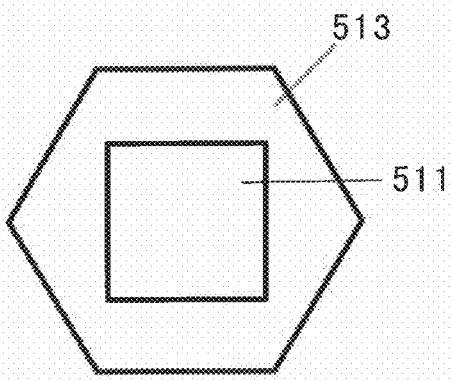

The shape of the shaft of the conductor post 510 is not limited to the cylindrical shape and may be arbitrary. For example, the shape of the shaft of the conductor post may be a multi-angular column shape. Specifically, as in FIGS. 35A to 35C that show the cross-sectional views (horizontally sectional views) that correspond to FIG. 4A, the shaft (the head portion 511 or the leg portion 512) of the conductor post 510 may be a triangular column shaft, a rectangular column shaft or a hexagonal column shaft. Even in this case, as shown in FIGS. 35A to 35C, it is preferable that the horizontal section shape of the shaft and the horizontal section shape of the flange portion 513 become a concentric circle shape. However, this is not essential. For example, as shown in FIGS. 36A to 36C, the conductor post 510 may have the shaft and the flange portion 513 each of which does not has a concentric circle shape.

Figure 37A:
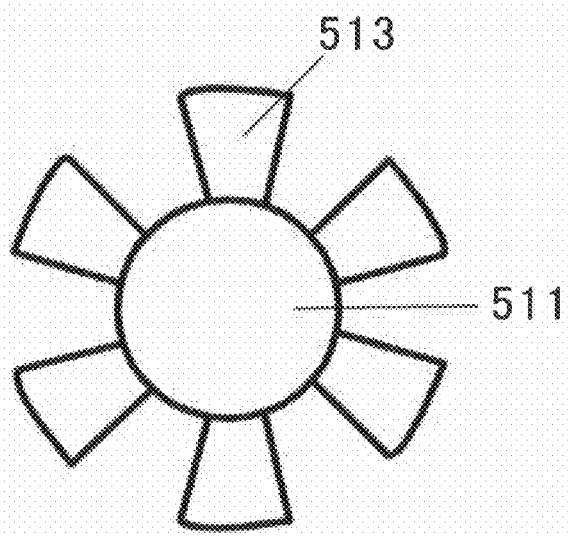
FIG. 37A is a plan view illustrating a flange portion that is divided in a circumferential direction, which is a modification of a conductor post.
Figure 37B:
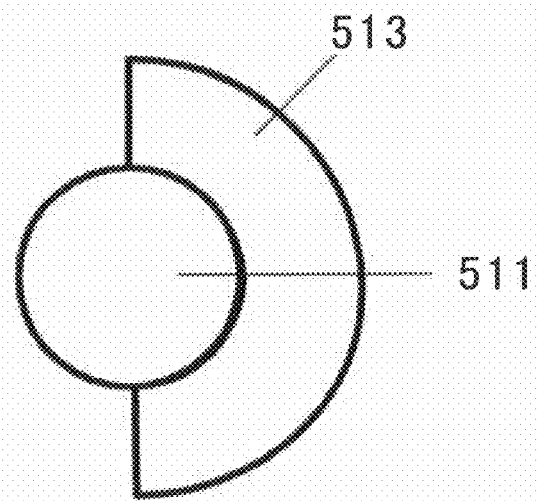
FIG. 37B is a plan view illustrating a flange portion that is composed of a semicircular piece, which is a modification of a conductor post.

The flange portion 513 of the conductor post 510 may also have an arbitrary shape as long as the flange portion protrudes in a radial direction with respect to the shaft. For example, as in FIG. 37A that shows a horizontal section, the flange portion 513 may be composed of multiple fan-shaped pieces that are divided in a circumferential direction. In this case, the multiple fan-shaped pieces are preferably disposed at equal intervals and symmetrical to the shaft. However, the flange portion 513 may have a structure that is asymmetrical to the shaft according to a utilization purpose. Specifically, for example, as shown in FIG. 37B, the flange portion 513 may be composed of one semicircular piece. In addition, one semicircular piece may be divided in a circumferential direction to form multiple fan-shaped pieces.

Figure 38A:
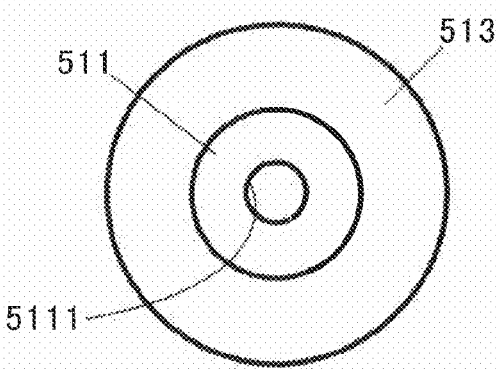
FIG. 38A is a plan view illustrating a hollow shaft, which is a modification of a conductor post.
Figure 38B:
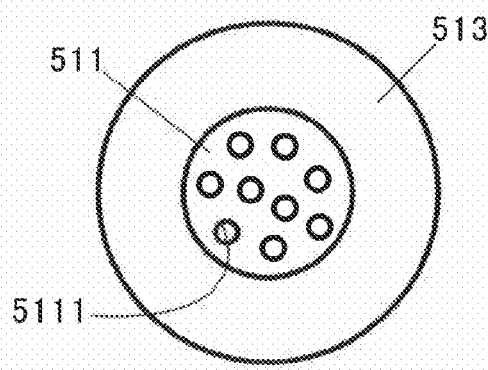
FIG. 38B is a plan view illustrating a shaft that has multiple holes (holes in an axial direction) formed over the entire shaft, which is a modification of a conductor post.
Figure 38C:
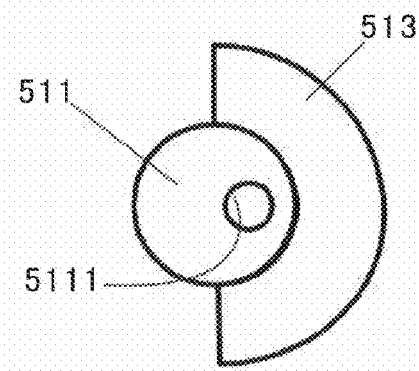
FIG. 38C is a plan view illustrating a shaft that has a hole (a hole in an axial direction) formed at a location shifted from the center of the shaft, which is a modification of a conductor post.

The shaft of the conductor post 510 may be a hollow shaft. For example, as shown in FIG. 38A, a hole 5111 (for example, through-hole) that extends in an axial direction may be formed at the center of the shaft (the head portion 511 or the leg portion 512) of the conductor post 510. Alternatively, as shown in FIG. 38B, the multiple holes 5111 may be formed (in a porous shape) over the entire shaft. If the holes 5111 are formed, it is possible to reduce the weight of the conductor post 510. In addition, in order to alleviate the deflection of the center of gravity, the arrangement of the holes 5111 may be determined according to a form (arrangement) of the flange portion 513. For example, as shown in FIG. 38C, the holes 5111 may be disposed to be shifted from the center of the shaft to the side of the flange portion 513.

Figure 39:
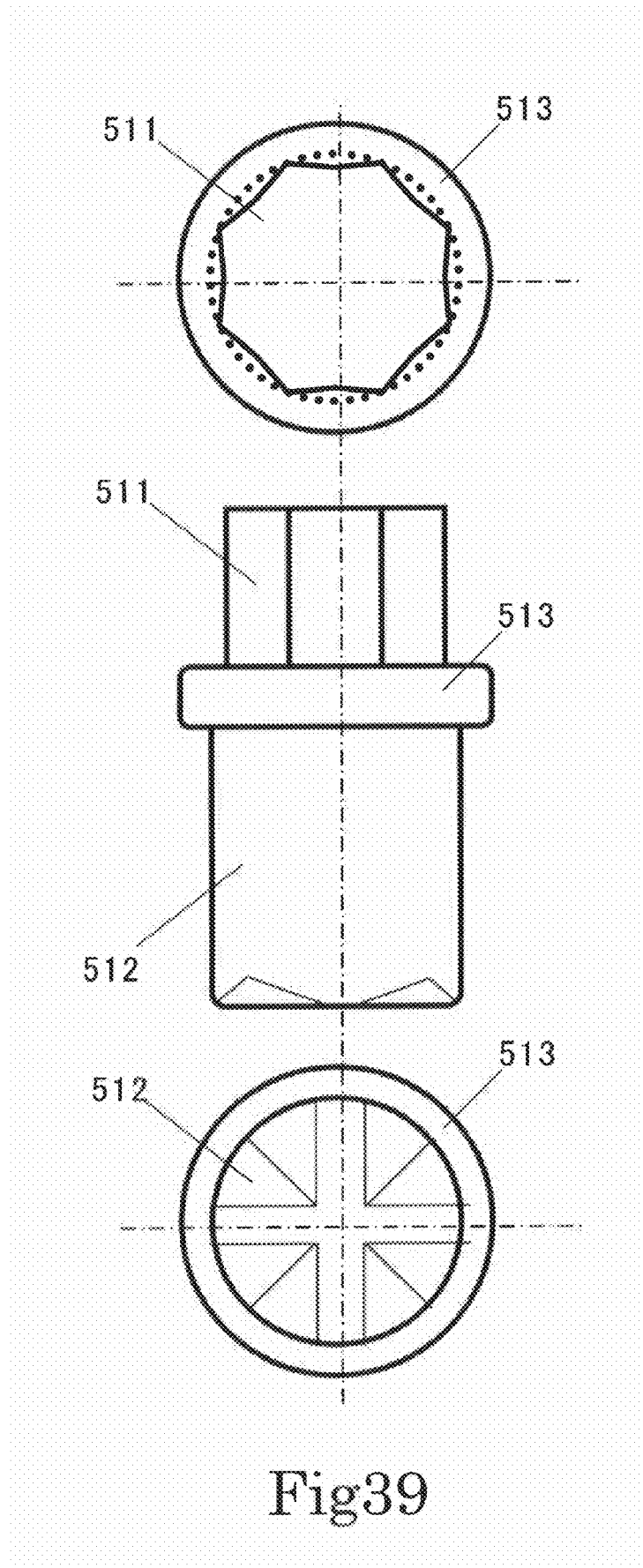
FIG. 39 is a top view, a side view, and a bottom view illustrating a conductor post that has a head portion and a leg portion each having a different shape, which is a modification of a conductor post.

In addition, the head portion 511 of the conductor post 510 and the leg portion 512 of the conductor post 510 may be formed to have different shapes (in particular, horizontal section shapes), respectively. For example, as shown in FIG. 39 (a top view, a side view, and a bottom view), a horizontal section of the head portion 511 may have an octagonal shape and a horizontal section of the leg portion 512 may have a circular shape.

The concavo-convex portions (refer to FIG. 5) of the surface that comes into contact with the flange portion 513 and the side of the conductor post 510 are not essential components, and may be omitted according to a utilization purpose. In addition, the conductor post 510 and the through-hole conductor 101b may be fitted to each other, such that surfaces of the conductor post 510 and the through-hole conductor 1016 come into contact with each other.

Figure 40:
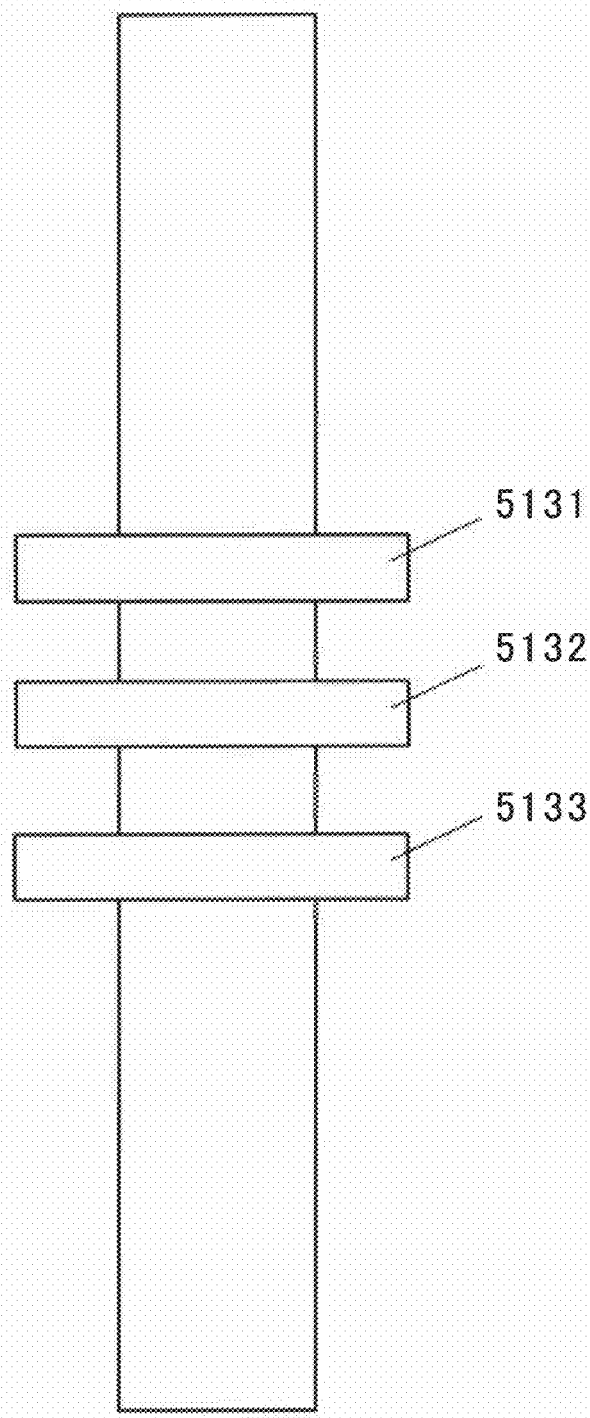
FIG. 40 is a view illustrating a conductor post that has multiple flange portions, which is a modification of a conductor post.

The number of flange portions may be arbitrary. For example, as shown in FIG. 40, it is possible to use a conductor post having plural (in this example, three) flange portions 5131 to 5133.

Figure 41A:
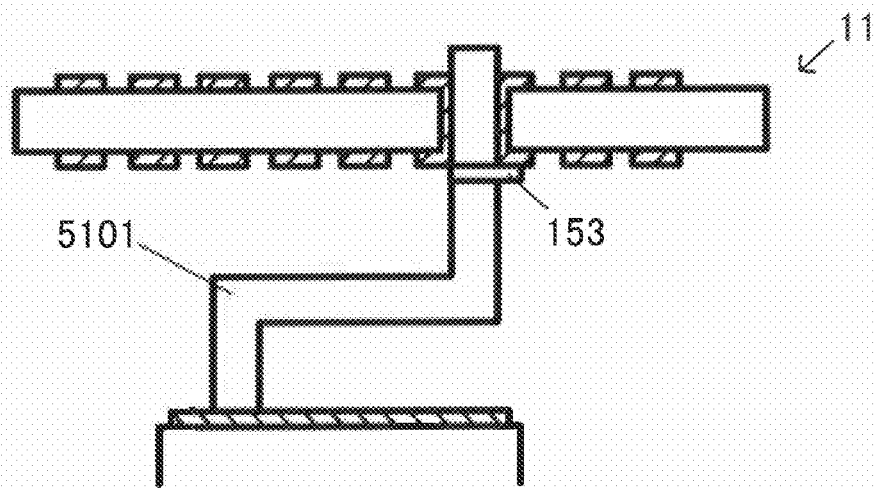
FIG. 41A is a view illustrating a conductor post that is composed of an L-shaped shaft, which is a modification of a conductor post.
Figure 41B:
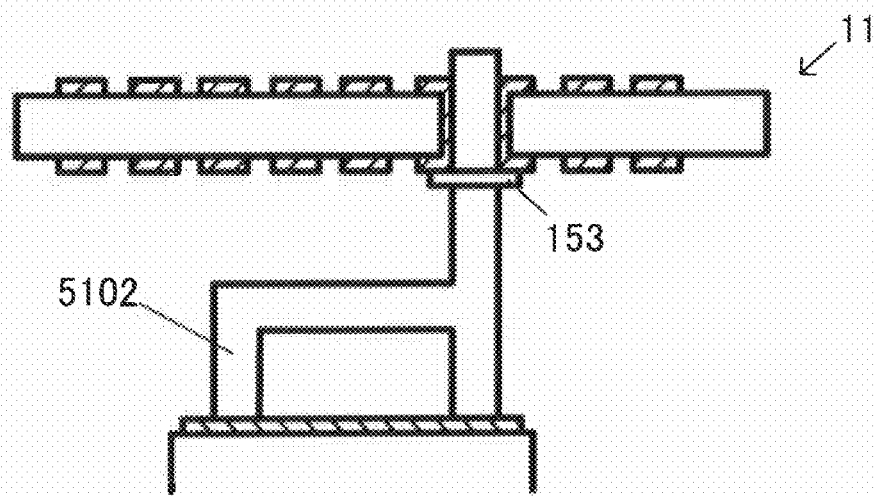
FIG. 41B is a view illustrating a conductor post that is composed of a shaft having two branch portions, which is a modification of a conductor post.

The shaft of the conductor post may have a bent portion. For example, as shown in FIG. 41A, the conductor post may be a conductor post 5101 that is composed of a shaft having an L shape. In addition, the shaft of the conductor post may have two or more branch portions. For example, as shown in FIG. 41B, the conductor post may be a conductor post 5102 that is composed of a shaft having two branch portions.

In the above-described embodiment, the conductor post group is formed using the multiple conductor posts, each of which has the same shape and the same material. However, the conductor post group may be formed using multiple conductor posts, each of which has a different shape or a different material.

In the above-described embodiment, the both-sided printed wiring boards 11 and 12 have been described. However, in the same form as the above embodiment, the present invention may be applied to a one-sided printed wiring board that has a conductor (wiring layer) formed on only one of the front and rear sides of the core.

Figure 42A:
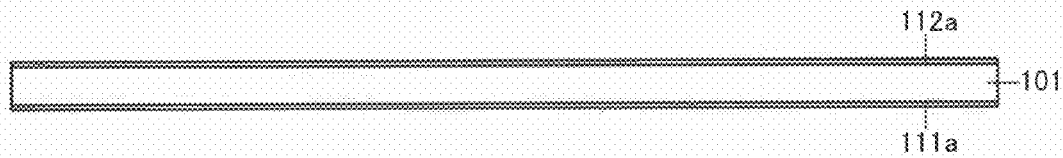
FIGS. 42A-42C are cross-sectional views illustrating a process for manufacturing a printed wiring board in a modification of a method for manufacturing a semiconductor device according to the present invention.
Figure 42B:
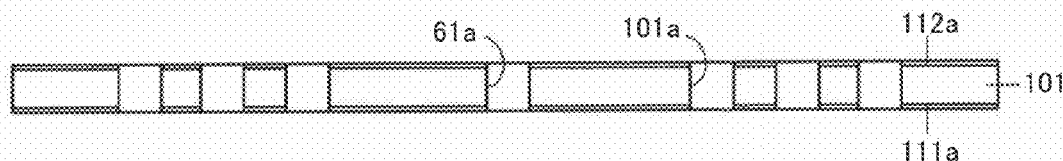
Figure 42C:
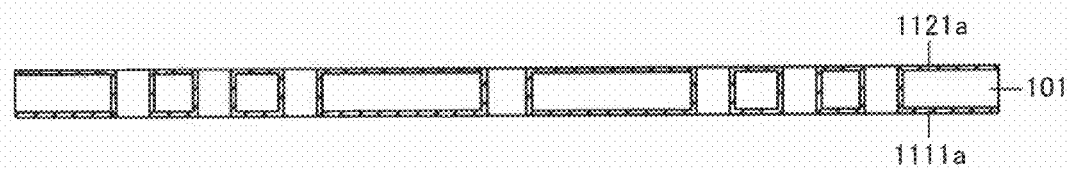

In the above-described embodiment, the tenting method has been described as one example of the manufacturing method of the printed wiring boards 11 and 12, but the present invention is not limited thereto. For example, as shown in FIGS. 42 and 43, the printed wiring boards 11 and 12 may be manufactured using a semi-additive process (SAP). Specifically, in this example, as shown in FIGS. 42A and 42B, through the same processes as those in FIGS. 9A and 9B, the through-holes 61a to 63a (refer to FIG. 1) and the through-holes 101a are formed (punched) in the both-sided copper clad laminate that has copper foils 111a and 112a. Next, for example, as shown in FIG. 42C, the resultant is subjected to non-electrolytic plating to further form copper films on the copper foils 111a and 112a, thereby increasing the thickness of each copper film. As a result, copper films 1111a and 1121a are formed.

Figure 43A:
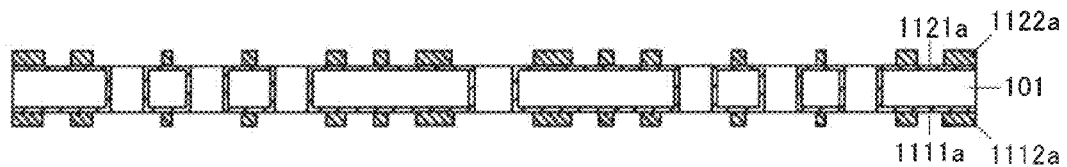
FIGS. 43A-43C are cross-sectional views illustrating a process for manufacturing a printed wiring board in the manufacturing method according to the same modification.
Figure 43B:
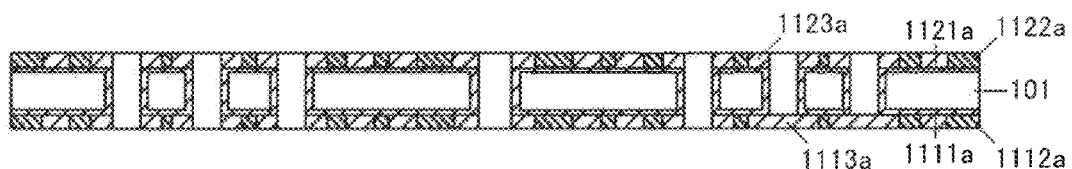
Figure 43C:
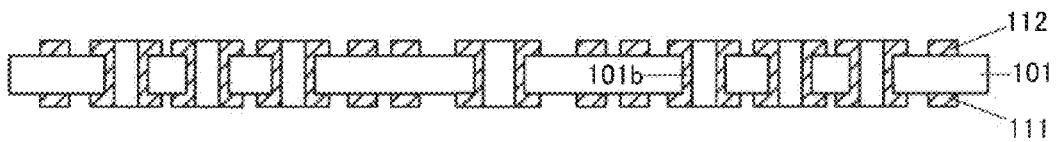

Next, for example, as shown in FIG. 43A, plating resists 1112a and 1122a are formed on the copper films 1111a and 1121a. Next, as shown in FIG. 43B, coppers 1113a and 1123a are subjected to electrolytic plating. In addition, by removing the plating resists 1112a and 1122a, as shown in FIG. 43C, the conductor patterns 111 and 112 are formed as wiring patterns and the through-hole conductor 101b is formed as interlayer connection. Then, the solder resists 114 and 113 are formed (film-formed or patterned) on the front and rear sides of the resultant, thereby finishing the printed wiring board shown in FIG. 3. If this method is used, it is possible to form the conductor patterns 111 and 112 that have a large thickness (for example, thickness of "150 μm").

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device, comprising:
    a plurality of electronic components, each of which has at least one electrode;
    a plurality of wiring boards, each of which has an insulating board, conductor circuits, and through-holes, the insulating board having a top surface and a bottom surface, the conductor circuits being formed on the top surface and the bottom surface of the insulating board, the through-holes penetrating through the insulating board and electrically connecting the conductor circuit of the top surface and the conductor circuit of the bottom surface; and
    a plurality of conductor posts, each of which has a flange portion, a head portion, and a leg portion, the flange portion having a first surface and a second surface on an opposite side of the first surface and having an external diameter larger than a diameter of each of the through-holes, the head portion protruding from the first surface of the flange portion, the leg portion protruding from the second surface of the flange portion,
    wherein the leg portion of each of the conductor posts is connected to the electrode of a respective one of the electronic components, the head portion of each of the conductor posts is inserted into a respective one of the through-holes such that the first surface of the flange portion of each of the conductor posts comes into contact with the bottom surface of a respective one of the wiring boards and the head portion of each of the conductor posts is electrically connected at an inner wall of a respective one of the through-holes.

2. A semiconductor device, comprising:
    a plurality of electronic components, each of which has an electrode;
    a plurality of wiring boards, each of which has an insulating board, conductor circuits, and through-holes, the insulating board having a top surface and a bottom surface, the conductor circuits being formed on the top surface and the bottom surface of the insulating board, the through-holes penetrating through the insulating board and electrically connecting the conductor circuit of the top surface and the conductor circuit of the bottom surface;
    a plurality of conductor posts, each of which has a flange portion, a head portion, and a leg portion, the flange portion having a first surface and a second surface on an opposite side of the first surface and having an external diameter larger than a diameter of each of the through-holes, the head portion protruding from the first surface of the flange portion, the leg portion protruding from the second surface of the flange portion,
    wherein the leg portion of each of the conductor posts is connected to the electrode of a respective one of the electronic components, the leg portion of each of the conductor posts is inserted into a respective one of the through-holes such that the second surface of the flange portion comes into contact with the top surface of a respective one of the wiring boards and the leg portion of each of the conductor posts is electrically connected at an inner wall of a respective one of the through-holes.

3. The semiconductor device according to claim 2, wherein the leg portion of each of the conductor posts protrudes from the bottom surface of a respective one of the wiring boards.

4. The semiconductor device according to claim 1, wherein an end face of the head portion of each of the conductor posts and an end face of the leg portion are substantially on the same plane.

5. The semiconductor device according to claim 1, wherein the head portion of each of the conductor posts protrudes from the top surface of a respective one of the wiring boards.

6. The semiconductor device according to claim 1, wherein at least one of the wiring boards has a hollow through-hole formed in the at least one of the wiring boards.

7. The semiconductor device according to claim 1, wherein at least one of the wiring boards has a dummy conductor circuit that is irrelevant to an electric operation on at least one surface of the insulating board of the at least one of the wiring boards.

8. The semiconductor device according to claim 1, further comprising one of a second electronic component and a heat waster disposed on the head portion of one of the conductor posts.

9. The semiconductor device according to claim 1, wherein the conductor posts and the electrode of a respective one of the electronic components are connected by at least one of solder bonding and metal bonding.

10. The semiconductor device according to claim 1, wherein the wiring boards and the electronic components have a mold resin filling spaces between the wiring boards and the electronic components.

11. The semiconductor device according to claim 1, wherein the conductor circuits formed on each of the wiring boards has a thickness which is in a range of 100 to 250 um.

12. The semiconductor device according to claim 1, wherein the electrode of at least one of the electronic components has a rough surface formed on a surface of the electrode of the at least one of the electronic components.

13. The semiconductor device according to claim 1, wherein at least one of the conductive posts has a groove formed in at least a portion of the at least one of the conductor posts.

14. The semiconductor device according to claim 1, wherein the head portion and the leg portion of each of the conductor posts have a length which is larger than a thickness of each of the wiring boards.

15. A method for manufacturing a semiconductor device, comprising:
    preparing wiring boards, each of which has a top surface, a bottom surface, and through-holes connecting the top surface and the bottom surface;
    preparing conductor posts, each of which has a flange portion, a head portion, and a leg portion, the flange portion having a first surface and a second surface on an opposite side of the first surface and having an external diameter larger than a diameter of each of the through-holes, the head portion protruding from the first surface of the flange portion, the leg portion protruding from the second surface of the flange portion;

inserting the conductor posts into the through-holes of the wiring boards, respectively;

connecting an electronic component to one of the head portion and the leg portion of a respective one of the conductor posts; and filling a mold resin into spaces between the wiring boards and the electronic components such that the electronic components are covered or sealed by the mold resin.

16. The method for manufacturing a semiconductor device according to claim 15, wherein the inserting of the conductor posts includes a process for inserting the conductor posts into the through-holes until one of the first surface and the second surface of the flange portion of each of the conductor posts comes into contact with a respective one of the wiring boards.

17. The method for manufacturing a semiconductor device according to claim 15, further comprising forming a groove in at least a portion of at least one of the conductor posts.

18. The method for manufacturing a semiconductor device according to claim 15, further comprising forming a rough surface on a surface of the electrode of at least one of the electronic components.

19. The method for manufacturing a semiconductor device according to claim 15, further comprising forming a hollow through-hole in at least one of the wiring boards.

20. A method for manufacturing a semiconductor device, comprising:

preparing wiring boards, each of which has a top surface, a bottom surface, and through-holes connecting the top surface and the bottom surface;

preparing conductor posts, each of which has a flange portion, a head portion, and a leg portion, the flange portion having a first surface and a second surface on an opposite side of the first surface and having an external diameter larger than a diameter of each of the through-holes, the head portion protruding from the first surface of the flange portion, the leg portion protruding from the second surface of the flange portion;

inserting the conductor posts into the through-holes of the wiring boards, respectively;

connecting an electronic component to one of the head portion and the leg portion of a respective one of the conductor posts; and forming a rough surface on a surface of the electrode of at least one of the electronic components.

21. The method for manufacturing a semiconductor device according to claim 20, wherein the inserting of the conductor posts includes a process for inserting the conductor posts into the through-holes until one of the first surface and the second surface of the flange portion of each of the conductor posts comes into contact with a respective one of the wiring boards.

22. The method for manufacturing a semiconductor device according to claim 20, further comprising forming a groove in at least a portion of at least one of the conductor posts.

23. The method for manufacturing a semiconductor device according to claim 20, further comprising forming a hollow through-hole in at least one of the wiring boards.

* * * * *